(12) United States Patent
Zhou et al.

(10) Patent No.: US 11,545,326 B2
(45) Date of Patent: Jan. 3, 2023

(54) HOT SWAP COMPONENT AND CIRCUIT BREAKING APPARATUS USED WITH CIRCUIT BREAKER

(71) Applicant: Huawei Digital Power Technologies Co., Ltd., Shenzhen (CN)

(72) Inventors: Bo Zhou, Shenzhen (CN); Xiaofei Pu, Xi'an (CN); Xiong Hu, Shenzhen (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 27 days.

(21) Appl. No.: 17/352,068

(22) Filed: Jun. 18, 2021

(65) Prior Publication Data

US 2021/0313134 A1    Oct. 7, 2021

Related U.S. Application Data

(63) Continuation of application No. PCT/CN2019/116165, filed on Nov. 7, 2019.

(30) Foreign Application Priority Data

Dec. 21, 2018 (CN) .......................... 201811573576.1

(51) Int. Cl.
*H02H 3/00* (2006.01)
*H01H 71/08* (2006.01)
*H01R 13/05* (2006.01)
*H01R 33/92* (2006.01)
*H05K 7/14* (2006.01)

(52) U.S. Cl.
CPC ........... *H01H 71/08* (2013.01); *H01R 13/052* (2013.01); *H01R 33/92* (2013.01); *H05K 7/14* (2013.01)

(58) Field of Classification Search
None
See application file for complete search history.

(56) References Cited

U.S. PATENT DOCUMENTS

| 2009/0046419 A1* | 2/2009 | Drake | G11B 33/128 |
| | | | 361/679.33 |
| 2020/0267869 A1* | 8/2020 | Hung | H05K 5/023 |

FOREIGN PATENT DOCUMENTS

| CN | 2838082 Y | 11/2006 |
| CN | 2852451 Y | 12/2006 |
| CN | 201247745 Y | 5/2009 |
| CN | 201515120 U | 6/2010 |
| CN | 202796781 U | 3/2013 |

(Continued)

*Primary Examiner* — Stephen W Jackson
(74) *Attorney, Agent, or Firm* — Leydig, Voit & Mayer, Ltd.

(57) ABSTRACT

A hot swap component is provided, which includes a movable portion and a fixed portion that may be electrically connected to each other by using electrical connectors. When a circuit breaker works, a pin that is of an electrical connector and that is located on the movable portion is correspondingly connected to a base located on the fixed portion, and the fixed portion and the circuit breaker inside the movable portion are conducted. When the circuit breaker is faulty and needs to be repaired and replaced, the movable portion can be pulled out from the fixed portion, and the circuit breaker is electrically disconnected from the fixed portion. An anti-electric shock protection mechanism of the fixed portion isolates a first base inside the fixed portion, thereby implementing safe hot swap of the circuit breaker.

20 Claims, 6 Drawing Sheets

(56) References Cited

FOREIGN PATENT DOCUMENTS

| | | | |
|---|---|---|---|
| CN | 103825145 | A | 5/2014 |
| CN | 103928779 | A | 7/2014 |
| CN | 102593724 | B | 4/2015 |
| CN | 104600468 | A | 5/2015 |
| CN | 104701105 | A | 6/2015 |
| CN | 204390934 | U | 6/2015 |
| CN | 205724068 | U | 11/2016 |
| CN | 106374262 | A | 2/2017 |
| CN | 106505415 | A | 3/2017 |
| CN | 206041091 | U | 3/2017 |
| CN | 206180384 | U | 5/2017 |
| CN | 206312842 | U | 7/2017 |
| CN | 206506058 | U | 9/2017 |
| CN | 207782049 | U | 8/2018 |
| CN | 207884040 | U | 9/2018 |
| CN | 207967605 | U | 10/2018 |
| CN | 109741997 | A | 5/2019 |
| JP | 2007048601 | A | 2/2007 |

\* cited by examiner

HOT SWAP COMPONENT AND CIRCUIT BREAKING APPARATUS USED WITH CIRCUIT BREAKER

CROSS-REFERENCE TO RELATED APPLICATIONS

This application is a continuation of International Application No. PCT/CN2019/116165, filed on Nov. 7, 2019, which claims priority to Chinese Patent Application No. 201811573576.1, filed on Dec. 21, 2018. The disclosures of the aforementioned applications are hereby incorporated by reference in their entireties.

TECHNICAL FIELD

Embodiments of the present application relate to the field of electric equipment technologies, and in particular, to a hot swap component and a circuit breaking apparatus used with a circuit breaker.

BACKGROUND

With the rapid development of internet technologies and application thereof, a data center has entered a stage of large-scale construction. The increasing demand for acquiring data undoubtedly poses a more severe challenge to a power supply system of the data center. When the power supply system is faulty, power supply usually needs to be interrupted to facilitate subsequent operation and maintenance. Once power supply of the power supply system is interrupted, the data center cannot provide continuous data services, and consequently, people's normal use is affected.

Specifically, at present, the power supply system usually includes a plurality of power distribution modules, and a circuit breaker is used as a loop protection device in the power distribution module. The circuit breaker is mainly configured to close and open a loop, and cut off a circuit when an abnormal case such as short circuit or severe overload occurs, thereby effectively protecting electrical devices in the loop. Currently, the circuit breaker in the power distribution module is mostly installed in a fixed manner. For safety, when a circuit breaker of a single power distribution module in the power supply system is faulty and temporary repair or replacement is required, a general circuit breaker of the system needs to be disconnected, in other words, a general power source of the power supply system is cut off. As mentioned above, once the power supply system is powered off, data service quality of the data center is severely affected, and consequently, inconvenience to people's lives is caused.

SUMMARY

Based on the foregoing technical problems, this application provides a hot swap component and a circuit breaking apparatus used with a circuit breaker, so that the circuit breaker can be pulled out without interrupting power supply, and there is no need to disconnect a general circuit breaker, thereby skipping affecting power supply of another power supply branch.

According to a first aspect, this application provides a hot swap component used with a circuit breaker, and the hot swap component includes a fixed portion and a movable portion that are electrically connected to each other by using electrical connectors.

The electrical connectors include a first electrical connector and a second electrical connector, the first electrical connector includes a first pin and a first base, and the second electrical connector includes a second pin and a second base. In this embodiment of this application, the first base and the second base are disposed on the fixed portion, and the first pin and the second pin are disposed on the movable portion. The electrical connector has a connection and conduction function in the hot swap component, where the first electrical connector is configured to conduct the fixed portion and the circuit breaker when the first pin is inserted into the first base, and the second electrical connector is configured to conduct the fixed portion and the circuit breaker when the second pin is inserted into the second base.

In this embodiment of this application, the fixed portion includes a current input end, a current output end, and an anti-electric shock protection mechanism. The current input end is electrically connected to the first base, and the current output end is electrically connected to the second base. The anti-electric shock protection mechanism includes an anti-electric shock protection cover and an adaptive mechanism, and the anti-electric shock protection cover can move between a first position and a second position under action of external force. In other words, the anti-electric shock protection cover is movable relative to another part in the fixed portion. The adaptive mechanism in the anti-electric shock protection mechanism has an auxiliary function on mobility of the anti-electric shock protection cover, and when an electrical connection between the fixed portion and the movable portion is removed, the adaptive mechanism can move the anti-electric shock protection cover from the second position to the first position.

In addition to the pins provided on the electrical connectors, the movable portion further includes a housing and a cover push rod. The housing is configured to accommodate the circuit breaker. When the circuit breaker is disposed inside the housing, the housing moves and drives the circuit breaker to move. When the movable portion is electrically connected to the fixed portion, the cover push rod of the movable portion can be configured to push the anti-electric shock protection cover to move from the first position to the second position, to be specific, transmitting external force to the anti-electric shock protection cover. When there is no external force, the anti-electric shock protection cover is located at the first position, and the first base is electrically isolated inside the fixed portion by using the anti-electric shock protection cover. When the anti-electric shock protection cover is in the second position under action of external force on the cover push rod side, the first base is no longer isolated by the anti-electric shock protection cover, and then the first pin can be inserted into the first base.

The movable portion and the fixed portion of the hot swap component described above may be electrically connected to each other by using the electrical connectors. When the circuit breaker works, a pin that is of an electrical connector and that is located on the movable portion is correspondingly connected to a base located on the fixed portion, so that the fixed portion and the circuit breaker inside the movable portion are conducted, and a current path from the current input end to the first electrical connector, the circuit breaker, the second electrical connector, and the current output end is formed. When the circuit breaker is faulty and needs to be repaired and replaced, the movable portion can be pulled out from the fixed portion, in other words, the electrical connection between the movable portion and the fixed portion is removed, and the circuit breaker is electrically disconnected from the fixed portion. Obviously, such a swappable structure facilitates device repair and replacement when compared to a fixed-mounted circuit breaker.

In addition, because the fixed portion is designed with the anti-electric shock protection mechanism, even if the fixed portion is always energized, the electrical connection between the movable portion and the fixed portion of the hot swap component can be removed at any time, so that the circuit breaker in the housing of the movable portion is electrically disconnected from the fixed portion, thereby implementing hot swap of the circuit breaker. In the mechanism, because the first base is connected to the current input end, and the current input end is connected to an external power source, that the first base is isolated inside the fixed portion by using the anti-electric shock protection mechanism can effectively avoid electric shock when maintenance personnel pull out the movable portion when a system is not powered off. Therefore, by using the hot swap component, the circuit breaker can be repaired and replaced without disconnecting a general circuit breaker in the system, so that power supply of another power supply branch is not affected. In addition, work safety of the maintenance personnel is ensured.

In the hot swap component described above, the adaptive mechanism provides a mobility possibility for the anti-electric shock protection cover of the anti-electric shock protection mechanism, to be specific, assisting the anti-electric shock protection cover moving between the first position and the second position. It may be understood that the adaptive mechanism may be implemented in a plurality of manners. Two non-limiting implementations are provided below. To facilitate understanding of a function and a role of the adaptive mechanism, description is performed with reference to the anti-electric shock protection cover in the following two implementations.

In a first example implementation, the adaptive mechanism includes a torsion spring and a guide rod. In this implementation, the anti-electric shock protection cover of the anti-electric shock protection mechanism is disposed on the fixed portion, specifically, a side that is of the fixed portion and that faces the movable portion when the fixed portion is electrically connected to the movable portion. The torsion spring of the adaptive mechanism is sleeved on the guide rod, and the torsion spring can rotate by using the guide rod as an axis after being sleeved on the guide rod. The guide rod is fastened on a side that is of the anti-electric shock protection cover and that is close to the fixed portion, and the torsion spring is in contact with the anti-electric shock protection cover. When the first pin is inserted into the first base, the cover push rod of the movable portion pushes the anti-electric shock protection cover to rotate around the guide rod under action of the torsion spring, to push the anti-electric shock protection cover, and then the anti-electric shock protection cover moves from the first position to the second position. When the first pin is pulled out from the first base, the anti-electric shock protection cover automatically moves from the second position to the first position under action of the torsion spring. In this implementation, because the torsion spring and the anti-electric shock protection cover are in contact with each other, the torsion spring rotates by using the guide rod as an axis, and the anti-electric shock protection cover also rotates from the second position to the first position or from the first position to the second position by using the guide rod as an axis.

In a second example implementation, the adaptive mechanism includes a guide mechanism and a first return spring. In this implementation, the guide mechanism is located on a side that is of the fixed portion and that faces the movable portion, the guide mechanism and the anti-electric shock protection cover are located on a same plane and are connected to each other, the first return spring is sleeved on the guide mechanism, and a protrusion is provided on a side that is of the anti-electric shock protection cover and that faces the movable portion. When the first pin is inserted into the first base, the cover push rod pushes the protrusion, the first return spring is compressed, and the guide mechanism moves along a direction (first direction) from the first position to the second position. The anti-electric shock protection cover is driven to move along the first direction to the second position, and then the first pin can be inserted into the first base. When the first pin is pulled out from the first base, the protrusion loses acting force, the first return spring gradually extends from a compressed state to a natural state, and the guide mechanism is reset along a direction (second direction) from the second position to the first position under action of the first return spring, and drives the anti-electric shock protection cover to be reset to the first position. After the anti-electric shock protection cover moves to the first position, the anti-electric shock protection cover electrically isolates the first base inside the fixed portion.

To improve compatibility of the hot swap component provided in this embodiment of this application, so that the hot swap component can be used with circuit breakers produced by a plurality of different brands, models, or manufacturers, in the hot swap component provided in this embodiment of this application, each electrical connector may further include a dual-curvature flexible contact sheet and an annular spring. Both the dual-curvature flexible contact sheet and the annular spring are disposed on the fixed portion of the hot swap component.

An implementation of the first electrical connector is the same as that of the second electrical connector. A first curvature of the corresponding dual-curvature flexible contact sheet is sleeved outside each of the first base and the second base, and a second curvature of the corresponding dual-curvature flexible contact sheet is sleeved outside each of the first pin and the second pin. The annular spring is sleeved on an outer part of each of the first curvature and the second curvature of the dual-curvature flexible contact sheet, and the annular spring is configured to tighten the dual-curvature flexible contact sheet. That the first pin is inserted into the first base is specifically that the first pin is inserted into the first base after passing through the dual-curvature flexible contact sheet corresponding to the first base, and that the second pin is inserted into the second base is specifically that the second pin is inserted into the second base after passing through the dual-curvature flexible contact sheet corresponding to the second base.

Both the dual-curvature flexible contact sheet and the annular spring are flexible parts, and a base and a pin of an electrical connector are connected by using the flexible parts, so that compatibility of the base and the pin is improved. Even if a model, brand, or manufacturer of the pin changes after repair and replacement, the pin can also be assembled with the base by using the flexible parts, so that the movable portion and the fixed portion of the hot swap component can be connected to each other, and the hot swap component can work normally. In addition, the flexible parts are configured to assist a connection between the pin and the base, so that insertion and pulling force required for inserting and pulling out the circuit breaker can be reduced, and a probability that a device is worn due to excessive insertion and pulling force is reduced.

In actual application, after the pin of the electrical connector is inserted into the base, an insertion stroke may not be in place. In this case, although the pin appears to be a fixed portion, because the insertion stroke is not in place, the pin actually is not in effective contact with the base, and the circuit breaker accommodated in the housing of the movable portion fails to be electrically connected to the fixed portion. As a result, the circuit breaker cannot work normally. To avoid this problem and improve work reliability of the hot swap component, it is necessary to detect the stroke of inserting the pin into the base. In the hot swap component provided in this embodiment of this application, the electrical connector may further include a stroke-in-place detection device configured to detect validity of the connection between the base and the pin in real time. For differentiation, a stroke-in-place detection device of the first electrical connector is referred to as a first stroke-in-place detection device, and a stroke-in-place detection device of the second electrical connector is referred to as a second stroke-in-place detection device.

The first stroke-in-place detection device is fastened on the first base, and the second stroke-in-place detection device is fastened on the second base. The first stroke-in-place detection device is configured to output a first stroke-in-place signal to a loop monitoring circuit when a stroke of inserting the first pin into the first base is in place. The second stroke-in-place detection device is configured to output a second stroke-in-place signal to the loop monitoring circuit when a stroke of inserting the second pin into the second base is in place. The loop monitoring circuit is configured to, when receiving the first stroke-in-place signal, determine that the stroke of the first pin is in place; and is further configured to, when receiving the second stroke-in-place signal, determine that the stroke of the second pin is in place.

Because the loop monitoring circuit can receive the first stroke-in-place signal and the second stroke-in-place signal, the loop monitoring circuit can determine, based on the first stroke-in-place signal, whether the stroke of inserting the first pin into the first base is in place, and determine, based on the second stroke-in-place signal, whether the stroke of inserting the second pin into the second base is in place. The loop monitoring circuit may correspondingly prompt a user about a stroke-in-place status of a pin, for example, the stroke of the first pin on the current input end side is in place, the stroke of the second pin on the current output end side is not in place, and then the user may correspondingly adjust insertion force of the movable portion of the hot swap structure towards the fixed portion, so that the stroke of second pin can be in place.

In the hot swap component provided in this embodiment of this application, the stroke-in-place detection device may be implemented in a plurality of manners. Two non-limiting implementations are provided below.

In a first implementation, a dry contact signal contact and a contact stroke contact are used to detect whether a stroke of a pin is in place.

The first stroke-in-place detection device includes a first dry contact signal contact and a first contact stroke contact, and the second stroke-in-place detection device includes a second dry contact signal contact and a second contact stroke contact. Both two contact points on the first dry contact signal contact and two contact points on the second dry contact signal contact are connected to the loop monitoring circuit. The first contact stroke contact is disposed in a bottom groove of the first base, the second contact stroke contact is disposed in a bottom groove of the second base, the first dry contact signal contact is disposed between the first contact stroke contact and a bottom surface of the bottom groove of the first base, and the second dry contact signal contact is disposed between the second contact stroke contact and a bottom surface of the bottom groove of the second base. When the stroke of inserting the first pin into the first base is in place, the first contact stroke contact is in contact with the first dry contact signal contact under pressure of the first pin, the two contact points that are on the first dry contact signal contact and that are at a predetermined distance apart are conducted by using the first contact stroke contact, and then the first stroke-in-place signal is sent to the loop monitoring circuit; and the loop monitoring circuit detects that a level status corresponding to the first stroke-in-place signal changes, and determines that the stroke of the first pin is in place. When the stroke of inserting the second pin into the second base is in place, the second contact stroke contact is in contact with the second dry contact signal contact under pressure of the second pin, the two contact points that are on the second dry contact signal contact and that are at a predetermined distance apart are conducted by using the second contact stroke contact, and then the second stroke-in-place signal is sent to the loop monitoring circuit; and the loop monitoring circuit detects that a level status corresponding to the second stroke-in-place signal changes, and determines that the stroke of the second pin is in place.

In a second implementation, a contact stroke contact and a varistor are used to detect whether a stroke of a pin is in place.

Specifically, for the first electrical connector, the first stroke-in-place detection device disposed on the first electrical connector includes a first contact stroke contact and a first varistor, two ends of the first varistor are connected to the loop monitoring circuit, the first contact stroke contact is disposed in a bottom groove of the first base, and the first varistor is disposed between the first contact stroke contact and a bottom surface of the bottom groove of the first base. When the stroke of inserting the first pin into the first base is in place, the first contact stroke contact is in contact with the first varistor under pressure of the first pin, and then the first stroke-in-place signal is sent to the loop monitoring circuit; and the loop monitoring circuit detects that a voltage signal corresponding to the first stroke-in-place signal changes, and determines that the stroke of the first pin is in place.

For the second electrical connector, the second stroke-in-place detection device disposed on the second electrical connector includes a second contact stroke contact and a second varistor, two ends of the second varistor are connected to the loop monitoring circuit, the second contact stroke contact is disposed in a bottom groove of the second base, and the second varistor is disposed between the second contact stroke contact and a bottom surface of the bottom groove of the second base. When the stroke of inserting the second pin into the second base is in place, the second contact stroke contact is in contact with the second varistor under pressure of the second pin, and then the second stroke-in-place signal is sent to the loop monitoring circuit; and the loop monitoring circuit detects that a voltage signal corresponding to the second stroke-in-place signal changes, and determines that the stroke of the second pin is in place.

In the foregoing several stroke-in-place detection devices, when a pin is not inserted into a base or pulled out from the base, a contact stroke contact loses or gradually loses pressure applied by the pin. To ensure that a stroke-in-place detection device accurately detects whether a stroke of a pin is in place, the hot swap component provided in this embodiment of this application adds, to the stroke-in-place detection device in an electrical connector, a limiting sleeve and a return spring that are of the stroke-in-place detection device. A reset mechanism is configured to ensure that the stroke-in-place detection device can be reset or gradually reset when the pin is not inserted into the base or is pulled out from the base.

Optionally, the first electrical connector further includes a first limiting sleeve and a second return spring, and the second electrical connector further includes a second limiting sleeve and a third return spring. For the first electrical connector, the second return spring is sleeved on the first contact stroke contact, the first limiting sleeve is sleeved on a side that is of the first contact stroke contact and that faces the movable portion, and the first limiting sleeve is disposed on a side that is of the second return spring and that faces the movable portion, and is configured to prevent the second return spring from coming out of the bottom groove of the first base.

For the second electrical connector, the third return spring is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base.

In a power distribution system, to improve system reliability and monitor a fault problem of temperature, current, voltage, or the like inside a circuit breaker in real time, the hot swap component provided in this embodiment of this application can further monitor a single circuit breaker loop. Specifically, the hot swap component monitors a working status of the circuit breaker by using a loop monitoring module. The loop monitoring module includes a backplane and a frame body. The backplane is fixedly disposed on the fixed portion, a slide rail is disposed on a side of the movable portion, the frame body is installed on the movable portion in a swappable manner by using the slide rail, and the loop monitoring circuit is disposed in the frame body.

The loop monitoring circuit is further configured to monitor the working status of the circuit breaker.

In this embodiment, according to a monitoring result provided by the loop monitoring module, the maintenance personnel can learn, in real time, a working status of the hot swap component, to be specific, whether an abnormality of current, voltage, temperature, or the like occurs on the hot swap component. Because each hot swap component may be configured with one loop monitoring module, a monitoring result of the loop monitoring module is in a one-to-one correspondence with the hot swap component. The hot swap component provided in the technical solutions of this application can autonomously locate a fault of a circuit breaker in a power supply system and autonomously perform warning, thereby improving reliability of the entire power distribution system, and facilitating maintenance work of the maintenance personnel.

To improve convenience of inserting and pulling out the hot swap component, an insertion and pulling handle disposed on the movable portion is further included. A worker using the hot swap component can pull out the movable portion from the fixed portion or insert the movable portion into the fixed portion by holding the insertion and pulling handle.

According to a second aspect, this application provides a hot swap circuit breaking apparatus, including a circuit breaker and the hot swap component provided in the first aspect. When a fixed portion and a movable portion of the hot swap component are electrically connected to each other, the circuit breaker is electrically connected to the fixed portion. When an electrical connection between the fixed portion and the movable portion is removed, the circuit breaker is electrically disconnected from the fixed portion.

Compared with the conventional technology, the present application has at least the following advantages:

The hot swap component includes the movable portion and the fixed portion that may be electrically connected to each other by using the electrical connectors. When the circuit breaker works, a pin that is of an electrical connector and that is located on the movable portion is correspondingly connected to a base located on the fixed portion, so that the fixed portion and the circuit breaker inside the movable portion are conducted, and a current path is from the current input end to the first electrical connector, the circuit breaker, the second electrical connector, and the current output end. When the circuit breaker is faulty and needs to be repaired and replaced, the movable portion can be pulled out from the fixed portion, in other words, the electrical connection between the movable portion and the fixed portion is removed, and the circuit breaker is electrically disconnected from the fixed portion. Obviously, such a swappable structure facilitates device repair and replacement when compared to a fixed-mounted circuit breaker.

In addition, because the fixed portion is designed with the anti-electric shock protection mechanism, even if the fixed portion is always energized, the electrical connection between the movable portion and the fixed portion of the hot swap component can be removed at any time, so that the circuit breaker in the housing of the movable portion is electrically disconnected from the fixed portion, thereby implementing hot swap of the circuit breaker. In the mechanism, because the first base is connected to the current input end, and the current input end is connected to an external power source, that the first base is isolated inside the fixed portion by using the anti-electric shock protection mechanism can effectively avoid electric shock when maintenance personnel pull out the movable portion when a system is not powered off. Therefore, by using the hot swap component, the circuit breaker can be repaired and replaced without disconnecting a general circuit breaker in the system, so that power supply of another power supply branch is not affected. In addition, work safety of the maintenance personnel is ensured.

BRIEF DESCRIPTION OF DRAWINGS

To describe the technical solutions in embodiments of this application more clearly, the following briefly describes accompanying drawings required for describing the embodiments. Definitely, the accompanying drawings in the following description show merely some embodiments of this application, and a person of ordinary skill in the art may further derive other accompanying drawings from these accompanying drawings without creative efforts.

DESCRIPTION OF EMBODIMENTS

Figure 1:
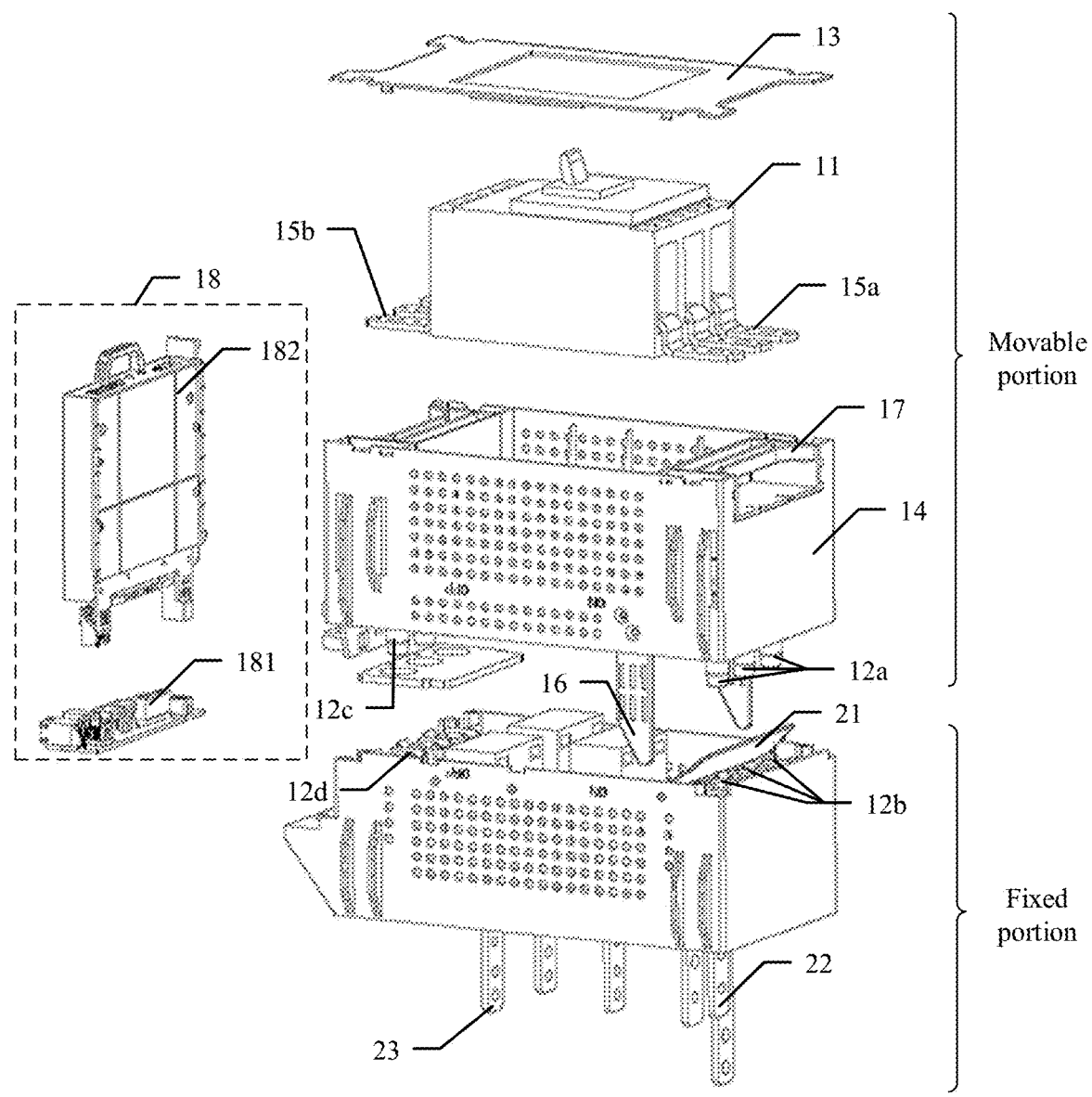
FIG. 1 is an exploded schematic diagram of a structure of a hot swap component according to an embodiment of this application.

As described above, an inventor finds through research that, when a circuit breaker of a single branch of a power distribution module in a power supply system is faulty and needs to be repaired or replaced, the circuit breaker usually affects the entire system, and a general circuit breaker of the system needs to be powered off. The main reason is that the current circuit breaker is mostly installed in a fixed manner and disassembly is inconvenient. Only after the entire system is powered off, maintenance personnel can smoothly and safely carry out a repair or replacement operation on the faulty circuit breaker. Obviously, in this repair mode in which the entire system needs to be powered off, a data service provided by a data center for a user is usually interrupted, and consequently, inconvenience to people's production and life is caused.

To resolve the foregoing problem, the inventor provides, through research, a hot swap component used with a circuit breaker, so that a faulty circuit breaker can be pulled out when the system is not powered off, and there is no need to disconnect a general circuit breaker, thereby skipping affecting power supply of another power supply branch. Before a specific implementation of the hot swap component is described in detail, technical terms involved in this application are first briefly described.

Hot swap is a technology that allows a user to remove or replace a damaged part when a system is not shut down or a power source is not powered off, thereby improving the system's ability to recover from disasters and faults in a timely manner, expandability, and flexibility.

A connector is a device that connects two active devices, and is configured to transmit current or signals, and bridge communication between blocked and isolated circuits, so that current can flow. This is an expected function of the circuit.

The hot swap component provided in the embodiments of this application includes two portions: a movable portion and a fixed portion, and the movable portion and the fixed portion may be electrically connected to each other by using electrical connectors. In the hot swap component, an electrical connector on one side leads current from the fixed portion to a circuit breaker in a housing of the movable portion, and an electrical connector on the other side conducts current from the circuit breaker to the fixed portion. When the circuit breaker works, the movable portion and the fixed portion of the hot swap component are electrically connected by using the electrical connectors, and the circuit breaker is electrically connected to the fixed portion to form a conductive circuit. When the circuit breaker needs to be repaired or replaced, an electrical connection between a pin of an electrical connector of the moveable portion of the hot swap component and a base of the electrical connector of the fixed portion is removed by using external force, and the circuit breaker is electrically disconnected from the fixed portion. Such a swappable structure of the hot swap component makes repair and replacement more convenient when compared to a fixed-mounted circuit breaker.

To implement safe hot swap of the circuit breaker, in the fixed portion of the hot swap component provided in the embodiments of this application, the inventor specially designs an anti-electric shock protection mechanism. The anti-electric shock protection mechanism includes an anti-electric shock protection cover and an adaptive mechanism. Under action of external force from the movable portion, the anti-electric shock protection cover can move between a first position and a second position by using the adaptive mechanism. When the anti-electric shock protection cover loses external force, the anti-electric shock protection cover is located at the first position, and a first base that can be energized and that is of an electrical connector is isolated inside the fixed portion. Therefore, by using the hot swap component, the circuit breaker can be repaired and replaced without disconnecting a general circuit breaker in the system, so that power supply of another power supply branch is not affected. In addition, work safety of the maintenance personnel is ensured.

To make a person skilled in the art understand the technical solutions in the present application better, the following clearly and completely describes the technical solutions in the embodiments of the present application with reference to the accompanying drawings in the embodiments of the present application. Definitely, the described embodiments are merely some rather than all of the embodiments of the present application. All other embodiments obtained by a person of ordinary skill in the art based on the embodiments of the present application without creative efforts shall fall within the protection scope of the present application.

Figure 2:
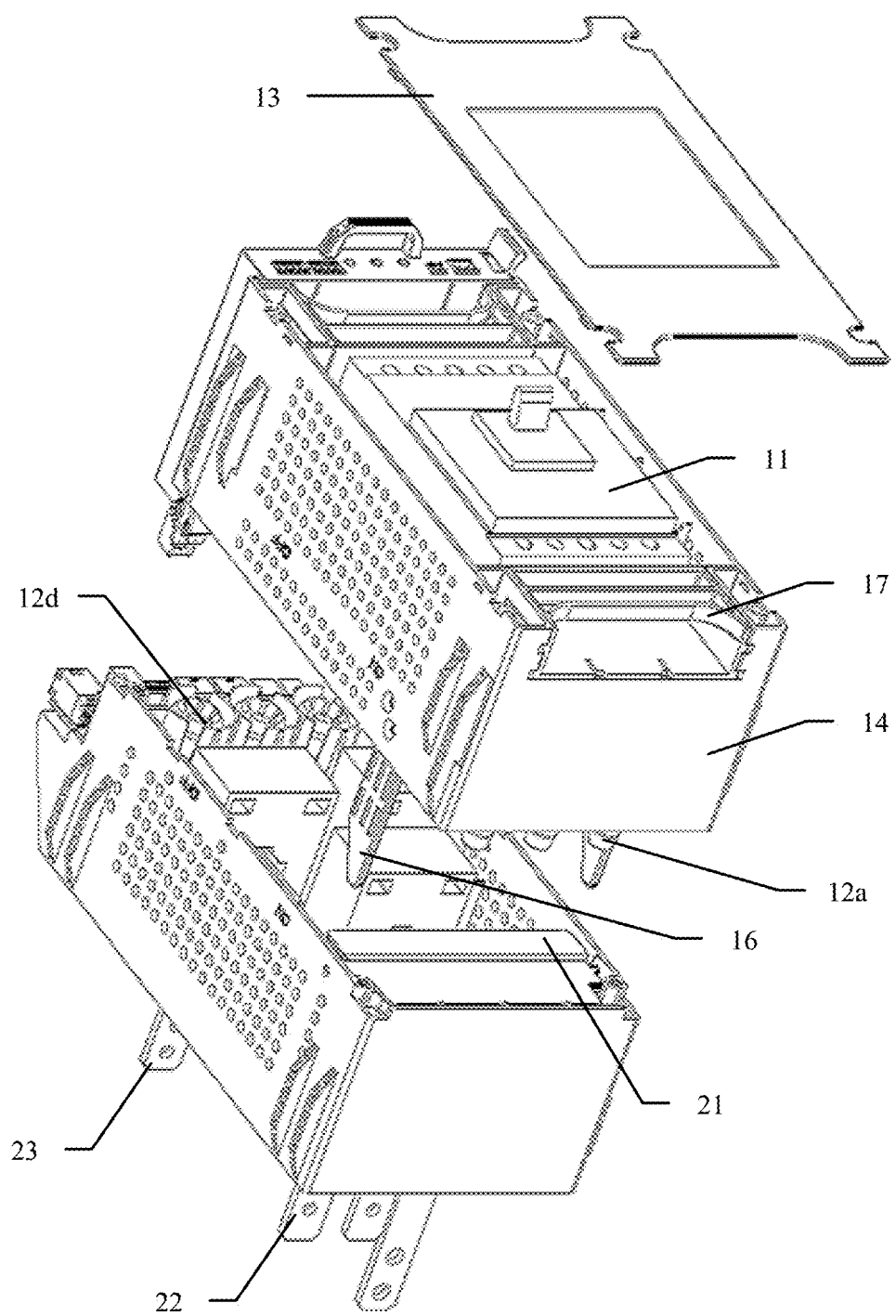
FIG. 2 is a schematic diagram in which a circuit breaker is assembled in a housing of a movable portion of a hot swap component according to an embodiment of this application.

FIG. 1 is an exploded schematic diagram of a structure of a hot swap component according to an embodiment of this application. FIG. 2 is a schematic diagram in which a circuit breaker is assembled in a housing of a movable portion of a hot swap component.

The hot swap component provided in this embodiment of this application includes a movable portion and a fixed portion, and the movable portion and the fixed portion in the mechanism may be electrically connected to each other by using electrical connectors.

In this embodiment, an electrical connector includes a pin and a base, the pin is located on the movable portion of the hot swap component, and the base is located on the fixed portion of the hot swap component. The pin can be inserted into the base under action of external force, thereby implementing a mutual electrical connection between the movable portion and the fixed portion. When a circuit breaker works, one side is a current inflow side, and the other side is a current outflow side. Therefore, the two sides respectively correspond to respective electrical connectors, to be specific, a first electrical connector and a second electrical connector. The first electrical connector corresponds to the current input side, and the second electrical connector corresponds to the current output side.

The first electrical connector includes a first pin 12a of the movable portion and a first base 12b of the fixed portion, and the second electrical connector includes a second pin 12c of the movable portion and a second base 12d of the fixed portion.

As shown in FIG. 1, the movable portion of the hot swap component in this embodiment includes a housing 14 and a cover push rod 16. The housing 14 may accommodate a circuit breaker 11. In actual application, the circuit breaker 11 may be assembled inside the housing 14, as shown in FIG. 2. When the circuit breaker 11 and the housing 14 are assembled together, the circuit breaker 11 is connected to the first pin 12a of the first electrical connector by using a transfer busbar 15a on one side, and the circuit breaker 11 is connected to the second pin 12c of the second electrical connector by using a transfer busbar 15b on the other side. As an example, the transfer busbar 15a and the transfer busbar 15b may be transfer copper bars. The first electrical connector is configured to conduct the fixed portion and the circuit breaker 11 when the first pin 12a is inserted into the first base 12b, and the second electrical connector is configured to conduct the fixed portion and the circuit breaker 11 when the second pin 12c is inserted into the second base 12d.

The fixed portion includes a current input end 22, a current output end 23, and an anti-electric shock protection mechanism. The current input end 22 is electrically connected to the first base 12b, to conduct current from outside of the hot swap component to the first base 12b. The current output end 23 is electrically connected to the second base 12d, to conduct current from the second base 12d to the outside of the hot swap component. According to the foregoing description, it may be understood that, when the first pin 12a and the first base 12b of the first electrical connector are engaged and connected, current conducted from the current input end 22 is conducted to the circuit breaker 11 in the housing 14 of the movable portion. When the second pin 12c and the second base 12d of the second electrical connector are engaged and connected, current is conducted from the circuit breaker 11 to the current output end 23, and then the current is led to the outside of the hot swap component by using the current output end 23.

A quantity of first electrical connectors is the same as a quantity of second electrical connectors, and both the quantity of first electrical connectors and the quantity of second electrical connectors are related to a quantity of wires in an application scenario of the circuit breaker. The circuit breaker 11 provided in this embodiment of this application may be applied to various power supply scenarios, for example, a two-phase power supply line, a three-phase power supply line, or a three-phase four-wire power supply line. A quantity of electrical connectors in this embodiment is not limited to the example shown in FIG. 1. An example in which a circuit breaker is applied to a three-phase power supply line or a three-phase four-wire power supply line is used for description in FIG. 1. As shown in FIG. 1, it can be seen that three transfer busbars (15a or 15b) are disposed on each side of the circuit breaker 11, and the three transfer busbars (15a or 15b) correspond to a three-phase power supply line.

In FIG. 1, a group of first electrical connectors includes three first electrical connectors, and a group of second electrical connectors includes three second electrical connectors. A quantity of transfer busbars on each side matches a total quantity of electrical connectors, and the transfer busbars 15a and 15b and the circuit breaker 11 may be in a detachably assembled connection relationship, or may be in a fixed connection relationship. The circuit breaker 11 is separately connected to first pins 12a of the three first electrical connectors by using three transfer busbars 15a on one side, and the circuit breaker 11 is separately connected to second pins 12c of the three second electrical connectors by using three transfer busbars 15b on the other side.

The following describes in detail acting mechanisms of the cover push rod 16 of the movable portion and the anti-electric shock protection mechanism of the fixed portion.

In this embodiment, the anti-electric shock protection mechanism includes an anti-electric shock protection cover 21 and an adaptive mechanism, and the anti-electric shock protection cover 21 can move between a first position and a second position under action of external force. The first position is a position at which the anti-electric shock protection cover 21 is located when the movable portion is not in contact with the fixed portion. The second position is a position at which the anti-electric shock protection cover 21 is located when the movable portion and the fixed portion are electrically connected to each other. Specifically, in this embodiment, the anti-electric shock protection cover 21 moves from the first position to the second position under action of the cover push rod of the movable portion.

When the anti-electric shock protection cover 21 is located at the first position, the first base 12b is electrically isolated inside the fixed portion by using the anti-electric shock protection cover 21, and when the anti-electric shock protection cover 21 is pushed to the second position by the cover push rod 16, the first pin 12a of the first electrical connector can be inserted into the first base 12b.

It should be noted that, in this embodiment, that the first base is electrically isolated inside the fixed portion by using the anti-electric shock protection cover means that when the anti-electric shock protection cover is located at the first position, a conductive part of the first base is not exposed to the outside, to prevent an operator from contacting the conductive part of the first base and getting an electric shock when inserting and pulling out the hot swap mechanism.

In this embodiment, the adaptive mechanism in the anti-electric shock protection mechanism assists the anti-electric shock protection cover 21 changing and moving between the first position and the second position. When the electrical connection between the fixed portion and the movable portion is removed, the adaptive mechanism can move the anti-electric shock protection cover 21 from the second position to the first position.

It may be understood that a structure of the circuit breaker 11 is a relatively familiar technical means for those skilled in the art. In this embodiment of this application, the circuit breaker 11 used with the hot swap component may use any structure design in the conventional technology. A specific structure of the circuit breaker 11 is not limited here, and details are not described again.

In this embodiment, the current input end 22 of the fixed portion may be specifically an input busbar, and the current output end 23 of the fixed portion may be specifically an output busbar. Both the current input end 22 and the current output end 23 are made of conductive materials.

The anti-electric shock protection mechanism is specially designed on the fixed portion of the hot swap component. It should be noted that although the anti-electric shock protection mechanism belongs to the fixed portion of the hot swap component, the anti-electric shock protection cover 21 and the adaptive mechanism in the anti-electric shock protection mechanism are movable relative to other parts of the fixed portion.

Because the cover push rod 16 capable of pushing the anti-electric shock protection cover to move is disposed on the movable portion, when the movable portion is inserted into the fixed portion, in other words, when a pin of an electrical connector is inserted into a base of the fixed portion, the cover push rod 16 can be in contact with a side that is of the anti-electric shock protection mechanism and that is close to the movable portion. The anti-electric shock protection mechanism moves under pushing action of the cover push rod 16, and is no longer blocked between the first pin 12a and the first base 12b, so that the first pin 12a of the first electrical connector can be smoothly inserted into the first base 12b of the fixed portion. When the movable portion is not inserted into the fixed portion, or the first pin 12a of the first electrical connector is pulled out from the first base 12b of the fixed portion, the cover push rod 16 is no longer in contact with the anti-electric shock protection mechanism. In this case, the anti-electric shock protection mechanism is no longer pushed by the cover push rod 16, and thus is in a reset state. The anti-electric shock protection mechanism in the reset state can isolate the energized current input end 22 and first base 12b inside the fixed portion.

In actual application, the maintenance personnel may remove the electrical connection between the movable portion and the fixed portion and disconnect an electrical connection between the circuit breaker 11 and the fixed portion, or insert the movable portion into the fixed portion to implement an electrical connection and thereby implementing the electrical connection between the circuit breaker 11 and the fixed portion, by holding the housing 14 of the movable portion of the hot swap component.

To improve convenience of inserting and pulling, an insertion and pulling handle 17 may be further disposed on the movable portion in this application, as shown in FIG. 1. When it is required to repair or replace the circuit breaker 11, the maintenance personnel can pull out or insert the movable portion by holding the insertion and pulling handle on the movable portion.

In addition, to improve reliability of assembling the movable portion and the circuit breaker 11, the movable portion of the hot swap component provided in this embodiment may further include a top cover 13, and the top cover 13 is used with the housing 14 of the movable portion. After the circuit breaker 11 is assembled in the housing 14, the housing 14 is assembled with the top cover 13, so that the circuit breaker 11 is packaged in the housing 14. When the circuit breaker 11 needs to be removed from the hot swap component, the top cover 13 is first detached and removed from the housing 14, and then the circuit breaker 11 is removed from the housing 14.

The hot swap component provided in the embodiments of this application is described above. The hot swap component includes the movable portion and the fixed portion that may be electrically connected to each other by using the electrical connectors. When the circuit breaker works, a pin that is of an electrical connector and that is located on the movable portion is correspondingly connected to a base located on the fixed portion, so that the fixed portion and the circuit breaker inside the movable portion are conducted, and a current path is from the current input end to the first electrical connector, the circuit breaker, the second electrical connector, and the current output end. When the circuit breaker is faulty and needs to be repaired and replaced, the movable portion can be pulled out from the fixed portion to remove the electrical connection, and then the circuit breaker is electrically disconnected from the fixed portion. Obviously, such a swappable structure facilitates device repair and replacement when compared to a fixed-mounted circuit breaker.

In addition, because the fixed portion is designed with the anti-electric shock protection mechanism, even if the fixed portion is always energized, the electrical connection between the movable portion and the fixed portion of the hot swap component can be removed at any time, so that the circuit breaker in the housing of the movable portion is electrically disconnected from the fixed portion, thereby implementing hot swap of the circuit breaker. In the mechanism, because the first base is connected to the current input end, and the current input end is connected to an external power source, that the first base is isolated inside the fixed portion by using the anti-electric shock protection mechanism can effectively avoid electric shock when maintenance personnel pull out the movable portion when a system is not powered off. Therefore, by using the hot swap component, the circuit breaker can be repaired and replaced without disconnecting a general circuit breaker in the system, so that power supply of another power supply branch is not affected. In addition, work safety of the maintenance personnel is ensured.

Based on a function and a role of the anti-electric shock protection mechanism in the hot swap component, this application further provides two specific implementations of the anti-electric shock protection mechanism. The following separately describes the two implementations of the anti-electric shock protection mechanism with reference to FIG. 3 and FIG. 4.

Figure 3:
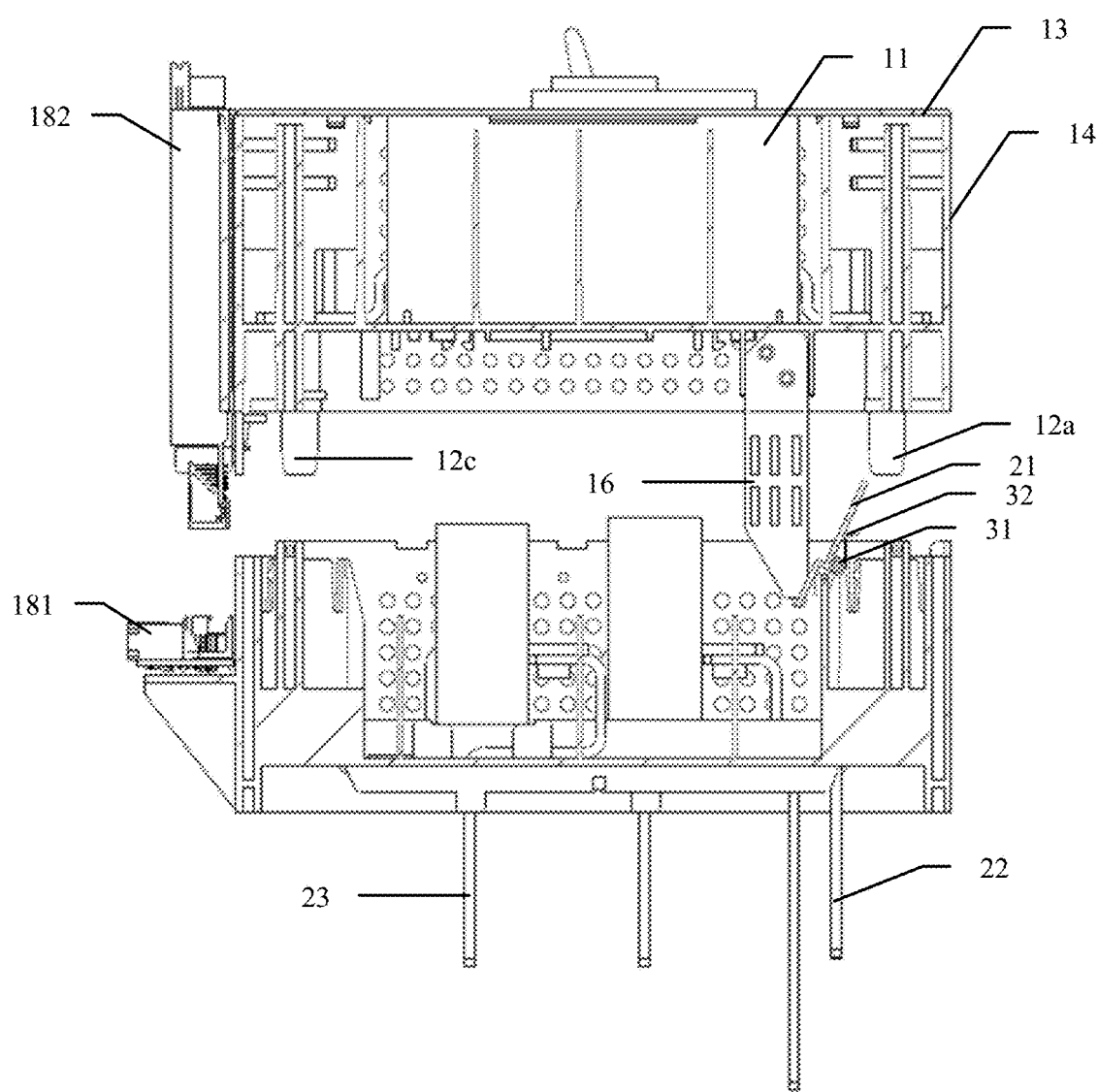
FIG. 3 is a front view of a hot swap component according to an embodiment of this application.

FIG. 3 is a front view of a hot swap component according to an embodiment of this application. The following describes an implementation of the anti-electric shock protection mechanism with reference to FIG. 3.

In FIG. 3, the cover push rod 16 is in contact with the fixed portion of the hot swap component, but a pin of an electrical connector is not connected to the fixed portion. Therefore, FIG. 3 shows a scenario in which the movable portion is not completely inserted into the fixed portion or the movable portion is not completely pulled out from the fixed portion.

In this implementation, the anti-electric shock protection mechanism includes the anti-electric shock protection cover 21 and the adaptive mechanism, and the adaptive mechanism specifically includes a guide rod 31 and a torsion spring 32. The anti-electric shock protection cover 21 is located on a side that is of the fixed portion and that faces the movable portion, the guide rod 31 is fastened on a side that is of the anti-electric shock protection cover 21 and that is close to the fixed portion, and the torsion spring 32 is sleeved on the guide rod 31. When the torsion spring 32 acts, the torsion spring rotates and twists based on an axis to which the guide rod 31 is fastened. When the first pin 12a is inserted into the first base 12b, the cover push rod 16 of the movable portion pushes the anti-electric shock protection cover 21 to rotate around the guide rod 31 under action of the torsion spring 32, so as to push the anti-electric shock protection cover 21 to move from the first position to the second position. When the first pin 12a is pulled out from the first base 12b, the anti-electric shock protection cover 21 is reset under action of the torsion spring 32, and the anti-electric shock protection cover 21 moves from the second position to the first position.

FIG. 3 is used as an example. When the cover push rod 16 pushes the anti-electric shock protection cover 21 to rotate under action of the torsion spring 32, the anti-electric shock protection cover 21 of the hot swap component is in a non-horizontal placement state from a perspective of FIG. 3. If the cover push rod 16 continues to move along a direction in which the fixed portion is located, and pushes the anti-electric shock protection cover 21 to move until the anti-electric shock protection cover 21 moves to the second position, the first pin 12a of the first electrical connector and the first base 12b of the fixed portion are in contact with each other, and finally connected. When the movable portion is separated from the fixed portion, in other words, when the cover push rod 16 cannot push the anti-electric shock protection cover 21, the anti-electric shock protection cover 21 is reset to the first position under action of the torsion spring 32. During the reset, the anti-electric shock protection cover 21 of the hot swap component is in a horizontal placement state from a perspective of FIG. 3 (reference may also be made to a position of the anti-electric shock protection cover 21 in FIG. 2), and the first base 12b is isolated inside the fixed portion.

Because FIG. 3 shows a scenario in which the movable portion is not completely inserted into the fixed portion, or a scenario in which the movable portion is not completely pulled out from the fixed portion, in FIG. 3, a position at which the anti-electric shock protection cover 21 is located is a position between the first position and the second position. In other words, after the movable portion is separated from the fixed portion, the anti-electric shock protection cover 21 is restored to the first position. When the circuit breaker of the movable portion is electrically connected to the fixed portion, the anti-electric shock protection cover 21 moves to the second position.

Figure 4:
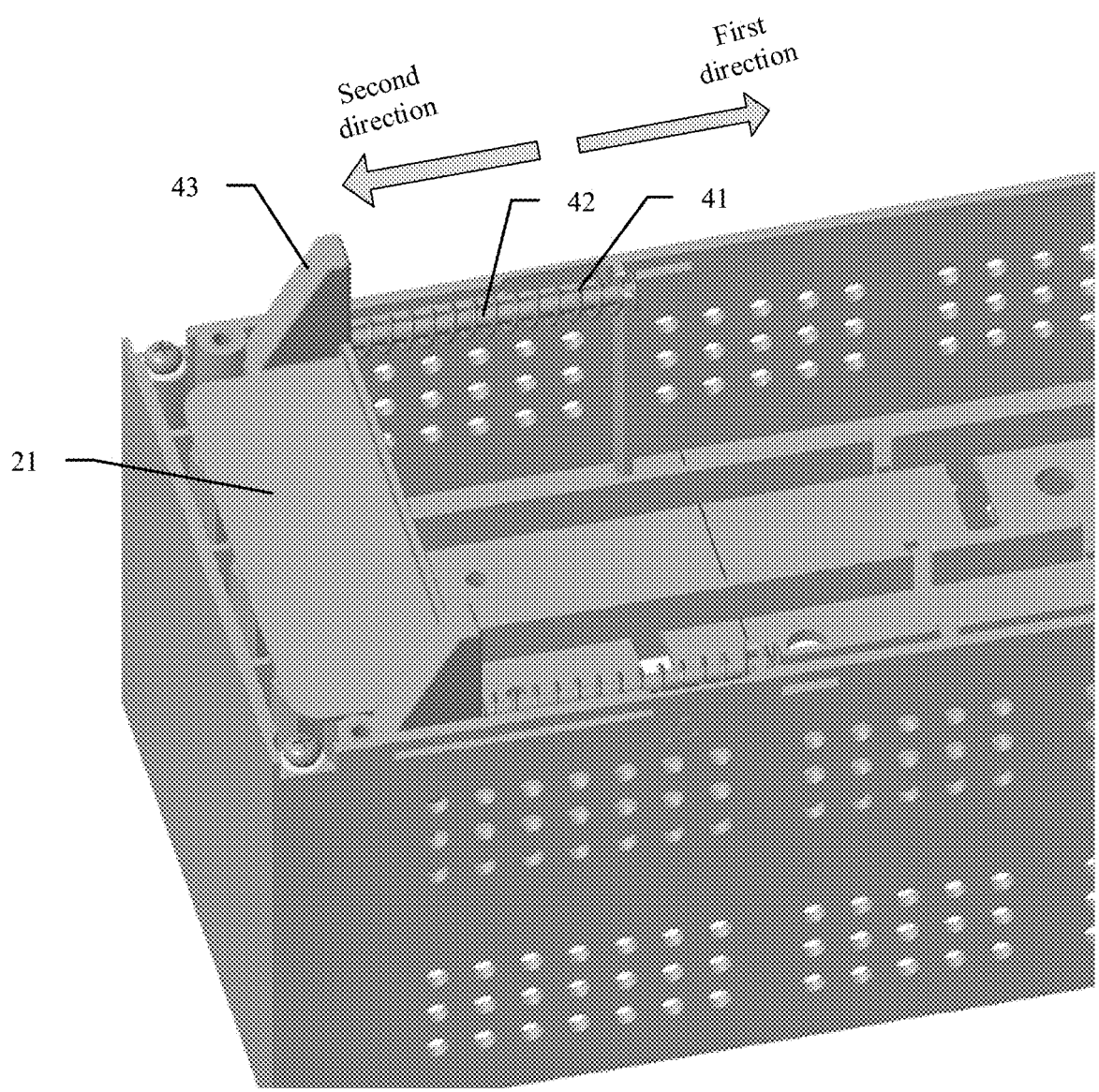
FIG. 4 is a schematic diagram of an anti-electric shock protection mechanism according to an embodiment of this application.

FIG. 4 is a schematic diagram of an anti-electric shock protection mechanism according to an embodiment of this application. The following describes another implementation of the anti-electric shock protection mechanism with reference to FIG. 4.

As shown in FIG. 4, the anti-electric shock protection mechanism includes the anti-electric shock protection cover 21 and the adaptive mechanism, and the adaptive mechanism specifically includes a first return spring 41 and a guide mechanism 42. The guide mechanism 42 is located on a side that is of the fixed portion and that faces the movable portion. As can be seen from FIG. 4, the guide mechanism 42 and the anti-electric shock protection cover 21 are located on a same plane, the guide mechanism 42 and the anti-electric shock protection cover 21 are connected to each other, and the first return spring 41 is sleeved on the guide mechanism 42. In FIG. 4, a protrusion 43 is provided on a side that is of the anti-electric shock protection cover 21 and that faces the movable portion. When the first pin 12a is inserted into the first base 12b, the cover push rod 16 is in contact with the protrusion 43, and pushes the protrusion 43 in a contact process, so that the guide mechanism 42 moves along a first direction parallel to an axial direction of the first return spring 41 under action of the first return spring 41, and drives the anti-electric shock protection cover 21 to move along the first direction, and then the first pin 12a is inserted into the first base 12b. When the first pin 12a is pulled out from the first base 12b, the guide mechanism 42 is reset along a second direction under action of the first return spring 41, and drives the anti-electric shock protection cover 21 to be reset, where the second direction is opposite to the first direction. The anti-electric shock protection cover 21 is configured to electrically isolate the first base 12b inside the fixed portion.

In this embodiment, the anti-electric shock protection cover 21 and the guide mechanism 42 may be fixedly connected, or may be assembled and connected. It can be learned from the foregoing description and with reference to FIG. 4 that, in a process in which a pin of the movable portion of the hot swap component is inserted into a base of the fixed portion and is pulled out from the base of the fixed portion, the anti-electric shock protection cover 21 translates along the first direction and the second direction separately. When the anti-electric shock protection cover 21 translates along the first direction, the first base 12b of the fixed portion is gradually exposed, so that the first pin 12a of the first electrical connector is inserted into the first base 12b in the fixed portion, and the hot swap component implements a working function thereof, in other words, the fixed portion is electrically connected to the circuit breaker of the movable portion. When the anti-electric shock protection cover 21 translates along the second direction, the first base 12b is gradually shielded, and the first base 12b is isolated inside the fixed portion. Because the first base 12b is connected to the current input end 22 of the fixed portion, after the first base 12b is shielded by the anti-electric shock protection cover 21, it is equivalent to that the current input end 22 is isolated by the anti-electric shock protection mechanism. Therefore, safe hot swap of the circuit breaker mechanism can be implemented, and safety and reliability of repair and replacement of the circuit breaker used with the hot swap component is improved. The hot swap component is used in the power supply system, so that the circuit breaker can be pulled out when the system is not powered off, and there is no need to disconnect the general circuit breaker, thereby skipping affecting power supply of another power supply branch.

It may be understood that, in a power distribution system, due to use consumption of devices, it may not be ensured that devices before and after replacement are of a same brand, a same model, or produced by a same manufacturer. Therefore, compatibility of other devices used with the device usually determines whether the replaced device can be used normally.

To improve compatibility of the hot swap component provided in the embodiments of this application, so that the hot swap component can be used with circuit breakers produced by a plurality of different brands, models, or manufacturers, the following describes in detail a structure of an electrical connector provided in the embodiments of this application with reference to the accompanying drawings. In the technical solutions provided in the embodiments of this application, the electrical connectors include a first electrical connector and a second electrical connector. A structure of the first electrical connector is the same as that of the second electrical connector. Therefore, for simplicity of description, the following uses the structure of the first electrical connector as an example for description.

Figure 5:
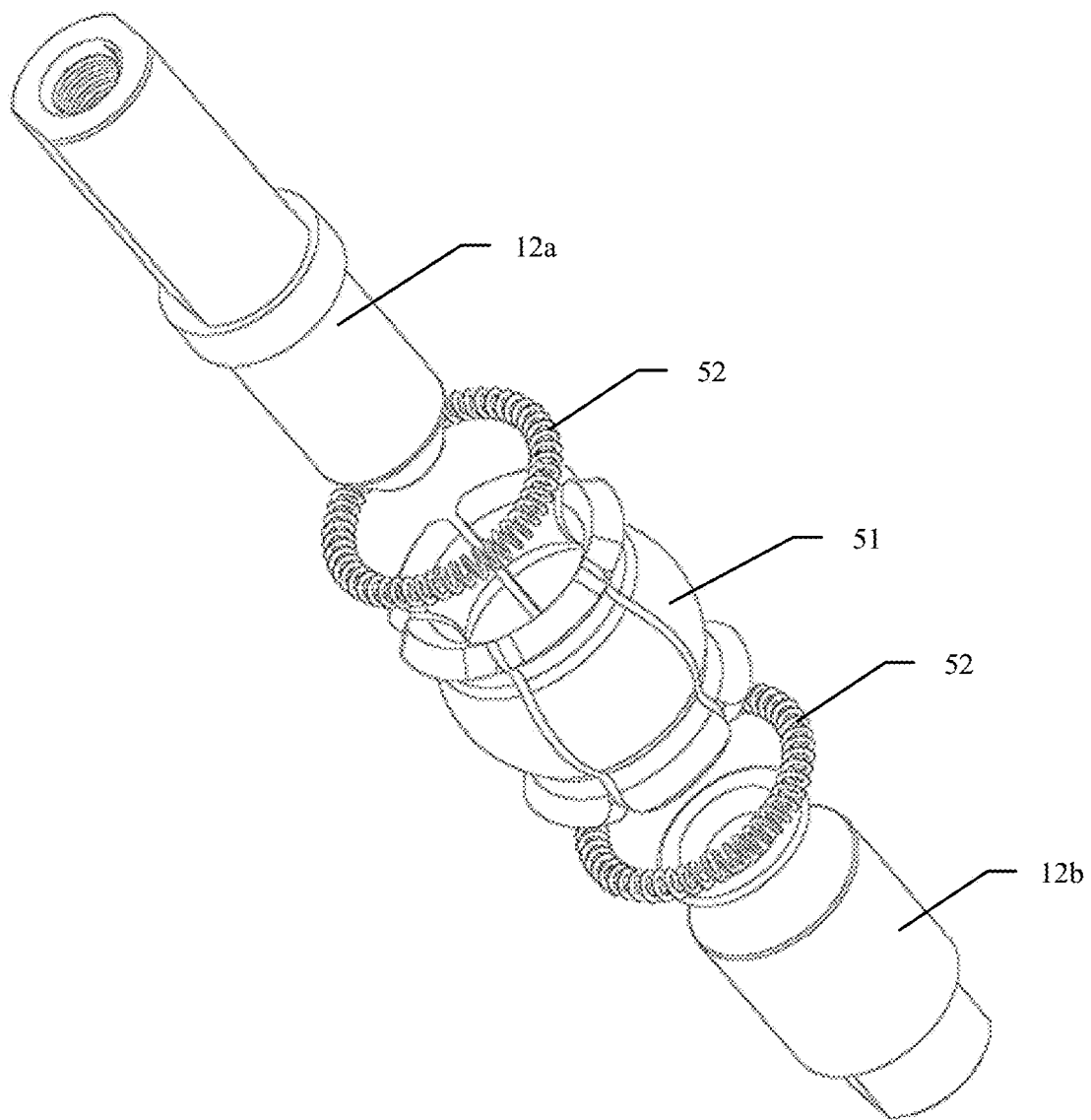
FIG. 5 is an exploded schematic diagram of a structure of a first electrical connector in a hot swap component according to an embodiment of this application.

FIG. 5 is an exploded schematic diagram of a structure of a first electrical connector in a hot swap component according to an embodiment of this application.

As shown in FIG. 5, the first electrical connector in the hot swap component provided in the embodiments of this application includes the first pin 12a located at the movable portion and the first base 12b located at the fixed portion, and a dual-curvature flexible contact sheet 51 and an annular spring 52 that are located at the fixed portion. The first pin 12a is equivalent to a male connector of the first electrical connector, and the first base 12b is equivalent to a female connector of the first electrical connector. The first base 12b is sleeved at a first curvature of the dual-curvature flexible contact sheet 51, and the first pin 12a is sleeved at a second curvature of the dual-curvature flexible contact sheet 51. The annular spring 52 is sleeved on an outer part of each of the first curvature and the second curvature of the dual-curvature flexible contact sheet 51, and the annular spring 52 is configured to tighten the dual-curvature flexible contact sheet 51. When the first pin 12a of the first electrical connector is connected to the first base 12b, the first pin 12a is specifically inserted into the first base 12b after passing through the dual-curvature flexible contact sheet 51.

In this embodiment, the first curvature and the second curvature of the dual-curvature flexible contact sheet 51 respectively refer to two convex curvature portions of an inner surface of the dual-curvature flexible contact sheet 51.

Figure 6:
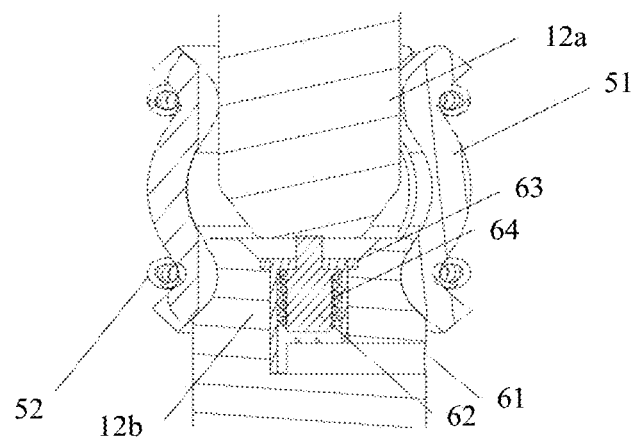
FIG. 6 is a schematic diagram of assembling a first electrical connector according to an embodiment of this application.

The outer part of the first curvature and the outer part of the second curvature respectively refer to two concave curvature portions on an outer part of the dual-curvature flexible contact sheet 51 that correspond to the two convex curvature portions of the inner surface. In other words, the annular spring 52 is sleeved on a concave curvature portion of the outer surface of the dual-curvature flexible contact sheet 51, so that a plurality of dual-curvature flexible contact sheets 51 are tightened into hollow cylindrical structures. FIG. 6 is a schematic diagram of assembling a first electrical connector according to an embodiment. It can be learned from FIG. 6 that the inner surface of the dual-curvature flexible contact sheet 51 has two convex curvature portions in total, where one convex curvature portion is in contact with a pin of the electrical connector, and the other convex curvature portion is in contact with a concave curved portion of an outer surface of a base. Two annular springs 52 are sleeved on concave curvature portions of an outer surface that correspond to the convex curvature portions of the inner surface of the dual-curvature flexible contact sheet.

It can be learned from FIG. 5 and FIG. 6, in this embodiment, when the movable portion of the hot swap component is inserted into the fixed portion, the first pin 12a of the first electrical connector is inserted from one side of a cylindrical structure surrounded by the dual-curvature flexible contact sheet 51 and the annular springs 52. Because the other side of the cylindrical structure is the first base 12b of the first electrical connector, when the first pin 12a is continuously inserted into the first base 12b under action of external force, insertion can be finally in place, thereby implementing interconnection between parts in the first electrical connector. In this embodiment, the first electrical connector uses the dual-curvature flexible contact sheet 51 and the annular spring 52. Because both the dual-curvature flexible contact sheet 51 and the annular spring 52 are flexible parts, tolerance of the electrical connector is relatively large. The first pin 12a can be successfully in contact with the first base 12b after reaching a specific depth, provided that an assembly error of an axis of the first pin 12a relative to an axis of a hole on the first base 12b is within the tolerance, thereby implementing interconnection between the movable portion and the fixed portion of the hot swap component. In addition, even if the first pin 12a is deflected or skewed relative to the hole on the first base 12b during insertion, the first pin 12a can be finally inserted towards a position at which the first base 12b is located, provided that the first pin is inserted into the cylindrical structure including the dual-curvature flexible contact sheet and the annular spring 52.

It can be seen that a base and a pin of an electrical connector are connected by using flexible parts, so that compatibility of the base and the pin is improved. Even if a model, brand, or manufacturer of the pin changes after repair and replacement, the pin can also be assembled with the base by using the flexible parts, so that the movable portion and the fixed portion of the hot swap component can be connected to each other, and the hot swap component can work normally. In addition, the flexible parts are configured to assist a connection between the pin and the base, so that insertion and pulling force required for inserting and pulling out the circuit breaker can be reduced, and a probability that a device is worn due to excessive insertion and pulling force is reduced.

The second electrical connector further includes a dual-curvature flexible contact sheet and an annular spring that are located at the fixed portion. A first curvature of the corresponding dual-curvature flexible contact sheet is sleeved outside the second base, and a second curvature of the corresponding dual-curvature flexible contact sheet is sleeved outside the second pin. The annular spring is sleeved on an outer part of each of the first curvature and the second curvature that are of the dual-curvature flexible contact sheet and that correspond to the second pin and the second base, to tighten the dual-curvature flexible contact sheet. The second pin is inserted into the second base after passing through the dual-curvature flexible contact sheet corresponding to the second base. It should be noted that, in this embodiment, a structure of the second electrical connector is the same as a structural implementation of the first electrical connector. Therefore, the structure of the second electrical connector is not described in detail, and reference may be made to related description of the structure of the first electrical connector.

With reference to FIG. 1 and FIG. 5, when the circuit breaker is actually connected to a power supply line, a loop of power supply current enters from the current input end 22, and passes through the first base 12b of the first electrical connector, the first pin 12a of the first electrical connector, the transfer busbar 15a, and the circuit breaker 11, and then flows out of the hot swap component from the transfer busbar 15b, the second pin 12c of the second electrical connector, the second base 12d of the second electrical connector, and the current output end 23.

It may be understood that, in the embodiments provided in this application, after a pin of an electrical connector is inserted into a base, an insertion stroke may not be in place. In this case, although the pin appears to be a fixed portion, the pin actually is not in effective contact with the base because the insertion stroke is not in place. To improve work reliability of the hot swap component, it is necessary to detect the stroke of inserting the pin into the base. Therefore, in the hot swap component provided in the embodiments of this application, the electrical connector may further include a stroke-in-place detection device configured to detect validity of a connection between the base and the pin in real time. For differentiation, a stroke-in-place detection device of the first electrical connector is referred to as a first stroke-in-place detection device, and a stroke-in-place detection device of the second electrical connector is referred to as a second stroke-in-place detection device.

When the stroke of inserting the pin into the base is in place, the stroke-in-place detection device (the first stroke-in-place detection device and the second stroke-in-place detection device) outputs a stroke-in-place signal (a first stroke-in-place signal and a second stroke-in-place signal) to a loop monitoring circuit. Therefore, the loop monitoring circuit can determine, based on the signal, that the stroke of inserting, into the base, the pin of the electrical connector to which the stroke-in-place detection device sending the signal belongs is in place, and can correspondingly prompt a worker that the base is effectively connected to the pin, and that the movable portion of the hot swap component is correctly connected to the fixed portion.

An embodiment of this application further provides several specific implementations of the stroke-in-place detection device. Because a structural implementation of the first electrical connector is the same as that of the second electrical connector. For simplicity of description, the following separately describes several different implementations of the first stroke-in-place detection device in the first electrical connector by using the first electrical connector as an example.

Implementation 1:

Referring to FIG. 6, the first stroke-in-place detection device in the figure includes a first dry contact signal contact 61 and a first contact stroke contact 62. Two contact points on the first dry contact signal contact 61 are connected to the loop monitoring circuit. The first contact stroke contact 62 is disposed in a bottom groove of the first base 12b, and the first dry contact signal contact 61 is disposed between the first contact stroke contact 62 and a bottom surface of the bottom groove of the first base 12b.

When a stroke of inserting the first pin 12a into the first base 12b is in place, the first contact stroke contact 62 is in contact with the first dry contact signal contact 61 under pressure of the first pin 12a, the two contact points that are on the first dry contact signal contact 61 and that are at a predetermined distance apart are conducted by using the first contact stroke contact 62, and then the first stroke-in-place signal is sent to the loop monitoring circuit. The loop monitoring circuit determines, by detecting that a level status corresponding to the first stroke-in-place signal changes, that the stroke of the first pin 12a is in place. When the stroke of the first pin 12a is in place, the first base 12b is effectively connected to the first pin 12a.

The structure of the second electrical connector is the same as that of the first electrical connector. Correspondingly, the second electrical connector includes the second stroke-in-place detection device, the second stroke-in-place detection device includes a second dry contact signal contact and a second contact stroke contact, the second contact stroke contact is disposed in a bottom groove of the second base, the second dry contact signal contact is disposed between the second contact stroke contact and a bottom surface of the bottom groove of the second base, and both two contact points on the second dry contact signal contact are connected to the loop monitoring circuit. When a stroke of inserting the second pin into the second base is in place, the second contact stroke contact is in contact with the second dry contact signal contact under pressure of the second pin, the two contact points that are on the second dry contact signal contact and that are at a predetermined distance apart are conducted by using the second contact stroke contact, and then the second stroke-in-place signal is sent to the loop monitoring circuit. The loop monitoring circuit detects that a level status corresponding to the second stroke-in-place signal changes, and determines that the stroke of the second pin is in place.

Implementation 2:

The first stroke-in-place detection device includes a first contact stroke contact 62 and a first varistor.

Two ends of the first varistor are connected to the loop monitoring circuit. The first contact stroke contact 62 is disposed in a bottom groove of the first base 12b, and the first varistor is disposed between the first contact stroke contact 62 and a bottom surface of the bottom groove of the first base 12b. When insertion of the first pin 12a is in place, the first contact stroke contact 62 is in contact with the first varistor under pressure of the first pin 12a. Because the first contact stroke contact 62 is a conductor, when the first contact stroke contact 62 is in contact with the first varistor, the two ends of the first varistor are conducted. In this case, the first stroke-in-place detection device sends the first stroke-in-place signal to the loop monitoring circuit, and the loop monitoring circuit can determine, by detecting that a voltage signal corresponding to the first stroke-in-place signal changes, that the stroke of the first pin 12a is in place, and further prompts a worker that the first base 12b is effectively connected to the first pin 12a.

The structure of the second electrical connector is the same as that of the first electrical connector. Correspondingly, the second electrical connector includes the second stroke-in-place detection device, and the second stroke-in-place detection device includes a second contact stroke contact and a second varistor. Two ends of the second varistor are connected to the loop monitoring circuit, the second contact stroke contact is disposed in a bottom groove of the second base, and the second varistor is disposed between the second contact stroke contact and a bottom surface of the bottom groove of the second base. When a stroke of inserting the second pin into the second base is in place, the second contact stroke contact is in contact with the second varistor under pressure of the second pin, and then the second stroke-in-place signal is sent to the loop monitoring circuit. The loop monitoring circuit detects that a voltage signal corresponding to the second stroke-in-place signal changes, and determines that the stroke of the second pin is in place.

In addition to the two implementations described above, the first stroke-in-place detection device may alternatively be a device in another form. For example, the first stroke-in-place detection device includes a first contact stroke contact 62 and a first capacitor. When the first contact stroke contact 62 approaches the first capacitor under pressure of the first pin 12a, and a stroke of inserting the first pin 12a into the first base 12b is in place, reactance of the first capacitor changes, so that the loop monitoring circuit can determine, by detecting that a signal of the first capacitor changes, that the stoke of the first pin 12a is in place, and that the first base 12b is effectively connected to the first pin 12a.

In addition, in this embodiment, the hot swap component may further detect, by detecting a magnetic field signal, whether a stroke of a pin of an electrical connector is in place. For example, the first stroke-in-place detection device includes a first magnetic bar. When the first magnetic bar is inserted deeply enough under action of the first pin 12a, in other words, after a stroke of inserting the first pin 12a is place, the loop monitoring circuit can detect that a magnetic field signal changes under action of the first magnetic bar. Therefore, the loop monitoring circuit can determine, by detecting the magnetic field signal, that the stroke of inserting the first pin 12a into the first base 12b is in place.

It should be noted that, in this embodiment, the structure of the second electrical connector is the same as the structural implementation of the first electrical connector. Therefore, an implementation of the first stroke-in-place detection device in the first electrical connector is the same as that of the second stroke-in-place device in the second electrical connector. For related descriptions of the second stroke-in-place device, reference can be made to the foregoing description and introduction of the first stroke-in-place device, and details are not described herein again.

It may be understood that, because the loop monitoring circuit can receive the first stroke-in-place signal and the second stroke-in-place signal, the loop monitoring circuit can determine, based on the first stroke-in-place signal, whether the stroke of inserting the first pin into the first base is in place, and determine, based on the second stroke-in-place signal, whether the stroke of inserting the second pin into the second base is in place. The loop monitoring circuit may correspondingly prompt a user about a stroke-in-place status of a pin, for example, the stroke of the first pin on the current input end side is in place, the stroke of the second pin on the current output end side is not in place, and then the user may correspondingly adjust insertion force of the movable portion of the hot swap structure towards the fixed portion, so that the stroke of second pin can be in place.

It should be noted that, in this embodiment, because a stroke-in-place detection device is configured to determine whether a stroke of inserting a pin into a base is in place, the device can determine, based on a sudden change in a detection signal when the stroke is in place, that the stroke of the pin is in place, and does not need to accurately detect a displacement amount of the pin. It may be understood that the several implementations of the stroke-in-place detection devices provided above are merely several examples provided by the inventor. In actual application, the hot swap component may further determine, by using another displacement detection method, whether a stroke of a pin of an electrical connector is in place. Therefore, a specific implementation of the stroke-in-place detection device is not limited in this embodiment of this application.

It may be understood that, in the foregoing several stroke-in-place detection devices, when a pin is not inserted into a base or is pulled out from the base, a contact stroke contact loses or gradually loses pressure applied by the pin. To ensure that a stroke-in-place detection device accurately detects whether a stroke of the pin is in place, the hot swap component provided in the embodiments of this application adds, to the stroke-in-place detection device in an electrical connector, a reset mechanism of the stroke-in-place detection device.

The reset mechanism is configured to ensure that the stroke-in-place detection device can be reset or gradually reset when the pin is not inserted into the base or is pulled out from the base. For the first electrical connector, a reset mechanism of the first electrical connector specifically includes a first limiting sleeve and a second return spring. For the second electrical connector, a reset mechanism of the second electrical connector specifically includes a second limiting sleeve and a third return spring. Because the structural implementation of the first electrical connector is the same as that of the second electrical connector. For simplicity of description, the following uses the first electrical connector as an example to describe and introduce an acting mechanism of a reset mechanism in an electrical connector.

Specifically, referring to FIG. 6, a second return spring 64 is sleeved on the first contact stroke contact 62. A first limiting sleeve 63 is sleeved on a side that is of the first contact stroke contact 62 and that faces the movable portion, and the first limiting sleeve 63 is disposed on a side that is of the second return spring 64 and that faces the movable portion, to prevent the second return spring 64 from coming out of the bottom groove of the first base 12b. As shown in FIG. 6, a diameter of a side that is of the first contact stroke contact 62 and that is close to the first pin 12a is relatively small, and a diameter of a side that is away from the first pin 12a is relatively large. The first limiting sleeve 63 is disposed at an upper end of the second return spring 64 in FIG. 6, and is wedged at a bottom of the round table-shaped hole on the first base 12b. When the first pin 12a is pulled out from the first base 12b, the second return spring 64 rebounds in a direction in which the first pin 12a is located, and drives the first contact stroke contact 62 to be away from the first dry contact signal contact 61 or away from the first varistor, to be specific, moving upward in FIG. 6.

Due to the existence of the first limiting sleeve 63 in the first electrical connector, the first contact stroke contact 62 does not move upward without restriction under action of the second return spring 64. When one side that is of the first contact stroke contact 62 and that is away from of the pin moves to the first limiting sleeve 63, because the diameter of the side is greater than a diameter of a hole on the first limiting sleeve 63, the first contact stroke contact is stopped by the first limiting sleeve 63 in time, so that the second return spring 64 and the first contact stroke contact 62 stop here and no longer move upward.

For the second electrical connector, the third return spring in the reset mechanism of the second electrical connector is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base. It should be noted that, in this embodiment, the structure of the second electrical connector is the same as the structural implementation of the first electrical connector. Therefore, an implementation of the reset mechanism in the first electrical connector is the same as that of the reset mechanism in the second electrical connector. For related description of the reset mechanism in the second electrical connector, reference can be made to the foregoing description and introduction of the first limiting sleeve 63 and the second return spring 64, and details are not described herein again.

In a power distribution system, to improve system reliability and monitor a fault problem of temperature, current, voltage, or the like inside a circuit breaker in real time, the hot swap component provided in the embodiments of this application can further monitor a single circuit breaker loop. Referring to FIG. 1, the hot swap component provided in the embodiments of this application may further include a loop monitoring module 18.

As shown in FIG. 1, the loop monitoring module 18 specifically includes two portions: a backplane 181 and a frame body 182. The backplane 181 is fixedly disposed on the fixed portion, and the frame body 182 is disposed on the movable portion.

In actual application, a slide rail is disposed on a side of the housing 14 that is used to install the frame body 182, and the frame body 182 can be installed on the housing 14 by using the slide rail. When the circuit breaker is installed in the housing 14, after the frame body 182 is installed on one side of the housing 14, the frame body 182 can be connected to the circuit breaker. The loop monitoring circuit mentioned above may be specifically disposed inside the frame body 182. The loop monitoring module 18 can further monitor a working status of the circuit breaker in the housing 14 of the movable portion of the hot swap component by using the loop monitoring circuit. For example, the loop monitoring module 18 determines, by monitoring current, voltage, temperature, and the like of the circuit breaker, whether the circuit breaker is in a normal working status.

In actual application, the loop monitoring circuit in the loop monitoring module 18 may be connected to an alarm.

The loop monitoring circuit monitors whether current on the transfer busbars 15a and 15b of the movable portion is abnormal, and when the current is abnormal, an alarm of the loop monitoring module 18 sounds. In an optional implementation, a current transformer may be disposed on the loop monitoring circuit, and specifically, the current transformer is configured to monitor whether current is abnormal. The loop monitoring circuit monitors whether loop voltage is abnormal, and a voltage transformer may be disposed in the voltage monitoring circuit, in other words, the voltage transformer may be specifically configured to determine the loop voltage. The loop monitoring circuit monitors temperature inside the circuit breaker, or temperature of a device in the loop, and when detecting an abnormality through monitoring, the alarm of the loop monitoring module 18 sounds. It can be seen that, in this embodiment, the loop monitoring module 18 can prompt a worker in time about an abnormal condition of an internal loop of the hot swap component, to prompt the worker to perform repair in time.

Referring to FIG. 3, in the figure, the frame body 182 is installed on a left side of the movable portion, and the backplane 181 is installed on a left side of the fixed portion. Optionally, a groove that can house the frame body 182 is provided in the backplane 181. When the movable portion moves to and is inserted into the fixed portion, the cover push rod 16 pushes the anti-electric shock protection cover 21, and the anti-electric shock protection cover 21 flips and moves under double action of the cover push rod 16 and the torsion spring. The movable portion continues to move towards the fixed portion, and a pin of an electrical connector is finally interconnected to a base of the fixed portion. In addition, a side that is of the frame body 182 and that is close to the fixed portion is inserted into the groove of the backplane 181 along a movement direction of the pin.

Optionally, to ensure reliability of a connection between the frame body 182 of the loop monitoring module 18 and the housing 14 of movable portion, in this application, the frame body 182 may further have a locking structure. After the frame body 182 is connected to the housing 14, the locking structure immediately locks the frame body 182 and the housing 14, to prevent the frame body 182 from accidentally falling off from one side of the housing 14. In this way, reliability of loop monitoring is correspondingly improved.

It may be understood that, in this embodiment, according to a monitoring result provided by the loop monitoring module 18, the maintenance personnel can learn, in real time, a working status of the hot swap component, to be specific, whether an abnormality of current, voltage, temperature, or the like occurs on the hot swap component. Because each hot swap component may be configured with one loop monitoring module 18, a monitoring result of the loop monitoring module 18 is in a one-to-one correspondence with the hot swap component. The hot swap component provided in the technical solutions of this application can autonomously locate a fault of a circuit breaker in the power supply system and autonomously perform warning, thereby improving reliability of the entire power distribution system, and facilitating maintenance work of the maintenance personnel.

Based on the hot swap component provided in the foregoing embodiments, an embodiment of this application correspondingly further provides a hot swap circuit breaking apparatus. The apparatus includes a circuit breaker and the hot swap component described above. The circuit breaker is used with the hot swap component, and the circuit breaker is specifically installed inside a housing 14 of a movable portion of the hot swap component. When a fixed portion and the movable portion of the hot swap component are electrically connected to each other, the circuit breaker is electrically connected to the fixed portion. When an electrical connection between the fixed portion and the movable portion is removed, the circuit breaker is electrically disconnected from the fixed portion.

When the circuit breaker is faulty and needs to be repaired or replaced, a pin of an electrical connector of the movable portion of the hot swap component may be pulled out from a base of the fixed portion, the electrical connection between the movable portion and the fixed portion is removed, and the circuit breaker is electrically disconnected from the fixed portion of the hot swap component. Obviously, such a swappable structure of the hot swap circuit breaking apparatus can facilitate repair and replacement of the circuit breaker when compared to a fixed-mounted circuit breaker.

In addition, because the fixed portion of the hot swap component is designed with an anti-electric shock protection mechanism, even if the fixed portion is always energized, the electrical connection between the movable portion and the fixed portion of the hot swap component is removed at any time, so that the circuit breaker in the housing of the movable portion is electrically disconnected from the fixed portion, thereby implementing hot swap of the circuit breaking apparatus. In the hot swap circuit breaking apparatus, a first base can lead an input current to the circuit breaker. Because the first base can be isolated inside the fixed portion by using the anti-electric shock protection mechanism, electric shock can be effectively avoided when the maintenance personnel pull out the movable portion of the hot swap component when the system is not powered off. Therefore, by using the hot swap component, the hot swap circuit breaking apparatus can implement repair and replacement of the circuit breaker under a condition that a power source is not powered off in the system, so that interruption of a data service powered by the circuit breaker is not caused, and work safety of the maintenance personnel is also ensured.

It should be understood that in this application, "at least one" means one or more, and "a plurality of" means two or more. "And/or" is used to describe an association relationship of associated objects, and indicates that three relationships may exist. For example, "A and/or B" may represent three cases: only A exists, only B exists, and both A and B exist, where A and B may be singular or plural. The character "/" generally indicates an "or" relationship between the associated objects. "At least one of the following items" or a similar expression thereof refers to any combination of these items, including any combination of a single item or a plurality of items. For example, at least one of a, b, or c may represent a, b, c, "a and b", "a and c", "b and c", or "a and b and c", where a, b, c may be singular or plural.

The foregoing descriptions are merely embodiments of the present application, but are not intended to limit any form of the present application. Although the preferred embodiments of the present application are disclosed above, the embodiments are not intended to limit the present application. By using the method and the technical content disclosed above, any person of ordinary skill in the art can make a plurality of possible changes and modifications on the technical solutions of the present application, or amend the technical solutions thereof to be embodiments with equal effects through equivalent variations without departing from the protection scope of the technical solutions of the present application. Therefore, any simple amendment, equivalent variation, and modification made on the foregoing embodiments according to the technical essence of the present application without departing from the content of the technical solutions of the present application shall fall within the protection scope of the technical solutions of the present application.

What is claimed is:

1. A hot swap component in alliance with a circuit breaker, wherein the hot swap component comprises a fixed portion and a movable portion that are electrically connected to each other by using electrical connectors, wherein the electrical connector comprises a first electrical connector and a second electrical connector, the first electrical connector comprises a first pin and a first base, the second electrical connector comprises a second pin and a second base, both the first base and the second base are located on the fixed portion, and both the first pin and the second pin are located on the movable portion;

the first electrical connector is configured to conduct the fixed portion and the circuit breaker when the first pin is inserted into the first base, and the second electrical connector is configured to conduct the fixed portion and the circuit breaker when the second pin is inserted into the second base;

the fixed portion comprises a current input end, a current output end, and an anti-electric shock protection mechanism, wherein the current input end is electrically connected to the first base, the current output end is electrically connected to the second base, and the anti-electric shock protection mechanism comprises an anti-electric shock protection cover and an adaptive mechanism, wherein the anti-electric shock protection cover is configured to move between a first position and a second position under an action of external force, and wherein the adaptive mechanism is configured to move the anti-electric shock protection cover from the second position to the first position when an electrical connection between the fixed portion and the movable portion is removed;

the movable portion comprises a housing and a cover push rod, the housing is configured to accommodate the circuit breaker, and the cover push rod is configured to push, when the movable portion is electrically connected to the fixed portion, the anti-electric shock protection cover to move from the first position to the second position;

when the anti-electric shock protection cover is located at the first position, the first base is electrically isolated inside the fixed portion by using the anti-electric shock protection cover; and when the anti-electric shock protection cover is located at the second position, the first pin is configured to be inserted into the first base.

2. The hot swap component according to claim 1, wherein the adaptive mechanism comprises a torsion spring and a guide rod; and the anti-electric shock protection cover is located on a side that is of the fixed portion and that faces the movable portion when the fixed portion is electrically connected to the movable portion, the guide rod is fastened to a side that is of the anti-electric shock protection cover and that is close to the fixed portion, and the torsion spring is sleeved on the guide rod;

when the first pin is inserted into the first base, the cover push rod of the movable portion pushes the anti-electric shock protection cover to rotate around the guide rod under action of the torsion spring, to push the anti-electric shock protection cover to move from the first position to the second position; and when the first pin is pulled out from the first base, the anti-electric shock protection cover moves from the second position to the first position under an action from the torsion spring.

3. The hot swap component according to claim 1, wherein the adaptive mechanism comprises a guide mechanism and a first return spring;

the guide mechanism is located on a side that is of the fixed portion and that faces the movable portion, the guide mechanism and the anti-electric shock protection cover are located on a same plane and are connected to each other, the first return spring is sleeved on the guide mechanism, and a protrusion is provided on a side that is of the anti-electric shock protection cover and that faces the movable portion; and when the first pin is inserted into the first base, the cover push rod pushes the protrusion, so that the guide mechanism moves along a first direction parallel to an axial direction of the first return spring under an action from the first return spring, and drives the anti-electric shock protection cover to move along the first direction, and then the first pin is inserted into the first base; and when the first pin is pulled out from the first base, the guide mechanism is reset along a second direction under action of the first return spring, and drives the anti-electric shock protection cover to be reset, wherein the second direction is opposite to the first direction, and the anti-electric shock protection cover is configured to electrically isolate the first base inside the fixed portion.

4. The hot swap component according to claim 1, wherein each of the first electrical connector and the second electrical connector further comprises a dual-curvature flexible contact sheet and an annular spring that are located on the fixed portion;

a first curvature of the associated dual-curvature flexible contact sheet is sleeved outside each of the first base and the second base, and a second curvature of the corresponding dual-curvature flexible contact sheet is sleeved outside each of the first pin and the second pin;

the annular spring is sleeved on an outer part of each of the first curvature and the second curvature of the dual-curvature flexible contact sheet, and the annular spring is configured to tighten the dual-curvature flexible contact sheet; and the first pin is inserted into the first base after passing through the dual-curvature flexible contact sheet associated with the first base, and the second pin is inserted into the second base after passing through the dual-curvature flexible contact sheet corresponding to the second base.

5. The hot swap component according to claim 1, wherein the first electrical connector further comprises a first stroke-in-place detection device, and the second electrical connector further comprises a second stroke-in-place detection device;

the first stroke-in-place detection device is fastened on the first base, the second stroke-in-place detection device is fastened on the second base, and the first stroke-in-place detection device is configured to output a first stroke-in-place signal to a loop monitoring circuit when a stroke of inserting the first pin into the first base is in place;

the second stroke-in-place detection device is configured to output a second stroke-in-place signal to the loop monitoring circuit when a stroke of inserting the second pin into the second base is in place; and the loop monitoring circuit is configured to, when receiving the first stroke-in-place signal, determine that the stroke of the first pin is in place and, further configured to, when receiving the second stroke-in-place signal, determine that the stroke of the second pin is in place.

6. The hot swap component according to claim 5, wherein the first stroke-in-place detection device comprises a first dry contact signal contact and a first contact stroke contact, and the second stroke-in-place detection device comprises a second dry contact signal contact and a second contact stroke contact;

both two contact points on the first dry contact signal contact and two contact points on the second dry contact signal contact are connected to the loop monitoring circuit;

the first contact stroke contact is disposed in a bottom groove of the first base, the second contact stroke contact is disposed in a bottom groove of the second base, the first dry contact signal contact is disposed between the first contact stroke contact and a bottom surface of the bottom groove of the first base, and the second dry contact signal contact is disposed between the second contact stroke contact and a bottom surface of the bottom groove of the second base;

when the stroke of inserting the first pin into the first base is in place, the first contact stroke contact is in contact with the first dry contact signal contact under pressure of the first pin, the two contact points that are on the first dry contact signal contact and that are at a predetermined distance apart are conducted by using the first contact stroke contact, and then the first stroke-in-place signal is sent to the loop monitoring circuit; and the loop monitoring circuit detects that a level status corresponding to the first stroke-in-place signal changes, and determines that the stroke of the first pin is in place; and when the stroke of inserting the second pin into the second base is in place, the second contact stroke contact is in contact with the second dry contact signal contact under pressure of the second pin, the two contact points that are on the second dry contact signal contact and that are at a predetermined distance apart are conducted by using the second contact stroke contact, and then the second stroke-in-place signal is sent to the loop monitoring circuit; and the loop monitoring circuit detects that a level status corresponding to the second stroke-in-place signal changes, and determines that the stroke of the second pin is in place.

7. The hot swap component according to claim 5, wherein the first stroke-in-place detection device comprises a first contact stroke contact and a first varistor, and the second stroke-in-place detection device comprises a second contact stroke contact and a second varistor;

two ends of the first varistor are connected to the loop monitoring circuit, and two ends of the second varistor are connected to the loop monitoring circuit;

the first contact stroke contact is disposed in a bottom groove of the first base, the second contact stroke contact is disposed in a bottom groove of the second base, the first varistor is disposed between the first contact stroke contact and a bottom surface of the bottom groove of the first base, and the second varistor is disposed between the second contact stroke contact and a bottom surface of the bottom groove of the second base;

when the stroke of inserting the first pin into the first base is in place, the first contact stroke contact is in contact with the first varistor under pressure of the first pin, and then the first stroke-in-place signal is sent to the loop monitoring circuit; and the loop monitoring circuit detects that a voltage signal corresponding to the first stroke-in-place signal changes, and determines that the stroke of the first pin is in place; and when the stroke of inserting the second pin into the second base is in place, the second contact stroke contact is in contact with the second varistor under pressure of the second pin, and then the second stroke-in-place signal is sent to the loop monitoring circuit; and the loop monitoring circuit detects that a voltage signal corresponding to the second stroke-in-place signal changes, and determines that the stroke of the second pin is in place.

8. The hot swap component according to claim 6, wherein the first electrical connector further comprises a first limiting sleeve and a second return spring, and the second electrical connector further comprises a second limiting sleeve and a third return spring;

the second return spring is sleeved on the first contact stroke contact, the first limiting sleeve is sleeved on a side that is of the first contact stroke contact and that faces the movable portion, and the first limiting sleeve is disposed on a side that is of the second return spring and that faces the movable portion, and is configured to prevent the second return spring from coming out of the bottom groove of the first base; and the third return spring is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base.

9. The hot swap component according to claim 5, further comprising a loop monitoring module, wherein the loop monitoring module comprises a backplane and a frame body;

the backplane is fixedly disposed on the fixed portion, a slide rail is disposed on a side of the movable portion, the frame body is installed on the movable portion in a swappable manner by using the slide rail, and the loop monitoring circuit is disposed in the frame body; and the loop monitoring circuit is further configured to monitor a working status of the circuit breaker.

10. The hot swap component according to claim 7, wherein the first electrical connector further comprises a first limiting sleeve and a second return spring, and the second electrical connector further comprises a second limiting sleeve and a third return spring;

the second return spring is sleeved on the first contact stroke contact, the first limiting sleeve is sleeved on a side that is of the first contact stroke contact and that faces the movable portion, and the first limiting sleeve is disposed on a side that is of the second return spring and that faces the movable portion, and is configured to prevent the second return spring from coming out of the bottom groove of the first base; and the third return spring is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base.

11. A hot swap circuit breaking apparatus, comprising a circuit breaker and a hot swap component, wherein the hot swap component comprises a fixed portion and a movable portion that are electrically connected to each other by using electrical connectors;

the electrical connector comprises a first electrical connector and a second electrical connector, the first electrical connector comprises a first pin and a first base, the second electrical connector comprises a second pin and a second base, both the first base and the second base are located on the fixed portion, and both the first pin and the second pin are located on the movable portion; the first electrical connector is configured to conduct the fixed portion and the circuit breaker when the first pin is inserted into the first base, and the second electrical connector is configured to conduct the fixed portion and the circuit breaker when the second pin is inserted into the second base;

the fixed portion comprises a current input end, a current output end, and an anti-electric shock protection mechanism, wherein the current input end is electrically connected to the first base, the current output end is electrically connected to the second base, and the anti-electric shock protection mechanism comprises an anti-electric shock protection cover and an adaptive mechanism, wherein the anti-electric shock protection cover is configured to move between a first position and a second position under an action of external force, and wherein the adaptive mechanism is configured to move the anti-electric shock protection cover from the second position to the first position when an electrical connection between the fixed portion and the movable portion is removed; and the movable portion comprises a housing and a cover push rod, the housing is configured to accommodate the circuit breaker, and the cover push rod is configured to push, when the movable portion is electrically connected to the fixed portion, the anti-electric shock protection cover to move from the first position to the second position, wherein when the anti-electric shock protection cover is located at the first position, the first base is electrically isolated inside the fixed portion by using the anti-electric shock protection cover, wherein when the anti-electric shock protection cover is located at the second position, the first pin is configured to be inserted into the first base, wherein when a fixed portion and a movable portion of the hot swap component are electrically connected to each other, the circuit breaker is electrically connected to the fixed portion, and wherein when an electrical connection between the fixed portion and the movable portion is removed, the circuit breaker is electrically disconnected from the fixed portion.

12. The hot swap circuit breaking apparatus according to claim 11, wherein the adaptive mechanism comprises a torsion spring and a guide rod; and the anti-electric shock protection cover is located on a side that is of the fixed portion and that faces the movable portion when the fixed portion is electrically connected to the movable portion, the guide rod is fastened to a side that is of the anti-electric shock protection cover and that is close to the fixed portion, and the torsion spring is sleeved on the guide rod;

when the first pin is inserted into the first base, the cover push rod of the movable portion pushes the anti-electric shock protection cover to rotate around the guide rod under action of the torsion spring, to push the anti-electric shock protection cover to move from the first position to the second position; and when the first pin is pulled out from the first base, the anti-electric shock protection cover moves from the second position to the first position under an action from the torsion spring.

13. The hot swap circuit breaking apparatus according to claim 11, wherein the adaptive mechanism comprises a guide mechanism and a first return spring;

the guide mechanism is located on a side that is of the fixed portion and that faces the movable portion, the guide mechanism and the anti-electric shock protection cover are located on a same plane and are connected to each other, the first return spring is sleeved on the guide mechanism, and a protrusion is provided on a side that is of the anti-electric shock protection cover and that faces the movable portion; and when the first pin is inserted into the first base, the cover push rod pushes the protrusion, so that the guide mechanism moves along a first direction parallel to an axial direction of the first return spring under an action from the first return spring, and drives the anti-electric shock protection cover to move along the first direction, and then the first pin is inserted into the first base; and when the first pin is pulled out from the first base, the guide mechanism is reset along a second direction under an action from the first return spring, and drives the anti-electric shock protection cover to be reset, wherein the second direction is opposite to the first direction, and the anti-electric shock protection cover is configured to electrically isolate the first base inside the fixed portion.

14. The hot swap circuit breaking apparatus according to claim 11, wherein each of the first electrical connector and the second electrical connector further comprises a dual-curvature flexible contact sheet and an annular spring that are located on the fixed portion;

a first curvature of the associated dual-curvature flexible contact sheet is sleeved outside each of the first base and the second base, and a second curvature of the associated dual-curvature flexible contact sheet is sleeved outside each of the first pin and the second pin;

the annular spring is sleeved on an outer part of each of the first curvature and the second curvature of the dual-curvature flexible contact sheet, and the annular spring is configured to tighten the dual-curvature flexible contact sheet; and the first pin is inserted into the first base after passing through the dual-curvature flexible contact sheet corresponding to the first base, and the second pin is inserted into the second base after passing through the dual-curvature flexible contact sheet corresponding to the second base.

15. The hot swap circuit breaking apparatus according to claim 11, wherein the first electrical connector further comprises a first stroke-in-place detection device, and the second electrical connector further comprises a second stroke-in-place detection device;

the first stroke-in-place detection device is fastened on the first base, the second stroke-in-place detection device is fastened on the second base, and the first stroke-in-place detection device is configured to output a first stroke-in-place signal to a loop monitoring circuit when a stroke of inserting the first pin into the first base is in place;

the second stroke-in-place detection device is configured to output a second stroke-in-place signal to the loop monitoring circuit when a stroke of inserting the second pin into the second base is in place; and the loop monitoring circuit is configured to, when receiving the first stroke-in-place signal, determine that the stroke of the first pin is in place; and further configured to, when receiving the second stroke-in-place signal, determine that the stroke of the second pin is in place.

16. The hot swap circuit breaking apparatus according to claim 15, wherein the first stroke-in-place detection device comprises a first dry contact signal contact and a first contact stroke contact, and the second stroke-in-place detection device comprises a second dry contact signal contact and a second contact stroke contact;

both two contact points on the first dry contact signal contact and two contact points on the second dry contact signal contact are connected to the loop monitoring circuit;

the first contact stroke contact is disposed in a bottom groove of the first base, the second contact stroke contact is disposed in a bottom groove of the second base, the first dry contact signal contact is disposed between the first contact stroke contact and a bottom surface of the bottom groove of the first base, and the second dry contact signal contact is disposed between the second contact stroke contact and a bottom surface of the bottom groove of the second base;

when the stroke of inserting the first pin into the first base is in place, the first contact stroke contact is in contact with the first dry contact signal contact under pressure of the first pin, the two contact points that are on the first dry contact signal contact and that are at a predetermined distance apart are conducted by using the first contact stroke contact, and then the first stroke-in-place signal is sent to the loop monitoring circuit;

the loop monitoring circuit detects that a level status corresponding to the first stroke-in-place signal changes, and determines that the stroke of the first pin is in place;

when the stroke of inserting the second pin into the second base is in place, the second contact stroke contact is in contact with the second dry contact signal contact under pressure of the second pin, the two contact points that are on the second dry contact signal contact and that are at a predetermined distance apart are conducted by using the second contact stroke contact, and then the second stroke-in-place signal is sent to the loop monitoring circuit; and the loop monitoring circuit detects that a level status corresponding to the second stroke-in-place signal changes, and determines that the stroke of the second pin is in place.

17. The hot swap circuit breaking apparatus according to claim 15, wherein the first stroke-in-place detection device comprises a first contact stroke contact and a first varistor, and the second stroke-in-place detection device comprises a second contact stroke contact and a second varistor;

two ends of the first varistor are connected to the loop monitoring circuit, and two ends of the second varistor are connected to the loop monitoring circuit;

the first contact stroke contact is disposed in a bottom groove of the first base, the second contact stroke contact is disposed in a bottom groove of the second base, the first varistor is disposed between the first contact stroke contact and a bottom surface of the bottom groove of the first base, and the second varistor is disposed between the second contact stroke contact and a bottom surface of the bottom groove of the second base;

when the stroke of inserting the first pin into the first base is in place, the first contact stroke contact is in contact with the first varistor under pressure of the first pin, and then the first stroke-in-place signal is sent to the loop monitoring circuit; and the loop monitoring circuit detects that a voltage signal corresponding to the first stroke-in-place signal changes, and determines that the stroke of the first pin is in place;

when the stroke of inserting the second pin into the second base is in place, the second contact stroke contact is in contact with the second varistor under pressure of the second pin, and then the second stroke-in-place signal is sent to the loop monitoring circuit; and the loop monitoring circuit detects that a voltage signal corresponding to the second stroke-in-place signal changes, and determines that the stroke of the second pin is in place.

18. The hot swap circuit breaking apparatus according to claim 16, wherein the first electrical connector further comprises a first limiting sleeve and a second return spring, and the second electrical connector further comprises a second limiting sleeve and a third return spring;

the second return spring is sleeved on the first contact stroke contact, the first limiting sleeve is sleeved on a side that is of the first contact stroke contact and that faces the movable portion, and the first limiting sleeve is disposed on a side that is of the second return spring and that faces the movable portion, and is configured to prevent the second return spring from coming out of the bottom groove of the first base; and the third return spring is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base.

19. The hot swap circuit breaking apparatus according to claim 15, further comprising a loop monitoring module, wherein the loop monitoring module comprises a backplane and a frame body;

the backplane is fixedly disposed on the fixed portion, a slide rail is disposed on a side of the movable portion, the frame body is installed on the movable portion in a swappable manner by using the slide rail, and the loop monitoring circuit is disposed in the frame body; and the loop monitoring circuit is further configured to monitor a working status of the circuit breaker.

20. The hot swap circuit breaking apparatus according to claim 17, wherein the first electrical connector further comprises a first limiting sleeve and a second return spring, and the second electrical connector further comprises a second limiting sleeve and a third return spring;

the second return spring is sleeved on the first contact stroke contact, the first limiting sleeve is sleeved on a side that is of the first contact stroke contact and that faces the movable portion, and the first limiting sleeve is disposed on a side that is of the second return spring and that faces the movable portion, and is configured to prevent the second return spring from coming out of the bottom groove of the first base; and the third return spring is sleeved on the second contact stroke contact, the second limiting sleeve is sleeved on a side that is of the second contact stroke contact and that faces the fixed portion, and the second limiting sleeve is disposed on a side that is of the third return spring and that faces the fixed portion, and is configured to prevent the third return spring from coming out of the bottom groove of the second base.

* * * * *